(12) United States Patent
Hwang

(10) Patent No.: US 8,643,048 B2
(45) Date of Patent: Feb. 4, 2014

(54) LIGHT EMITTING DEVICE

(75) Inventor: Sungmin Hwang, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 113 days.

(21) Appl. No.: 13/434,299

(22) Filed: Mar. 29, 2012

(65) Prior Publication Data

US 2013/0099265 A1  Apr. 25, 2013

(30) Foreign Application Priority Data

Oct. 24, 2011  (KR) .................. 10-2011-0108760

(51) Int. Cl.
*H01L 33/00* (2010.01)
(52) U.S. Cl.
USPC .................. 257/98; 257/99; 257/E33.066
(58) Field of Classification Search
USPC ............... 257/81, 98, 99, E33.061, E33.062, 257/E33.066
See application file for complete search history.

(56) References Cited

U.S. PATENT DOCUMENTS

| | | | | |
|---|---|---|---|---|
| 6,642,548 B1* | 11/2003 | Brown et al. | ................... | 257/99 |
| 7,566,909 B2* | 7/2009 | Koyama | .......................... | 257/80 |
| 8,049,243 B2* | 11/2011 | Kamei et al. | .................... | 257/99 |
| 8,217,417 B2* | 7/2012 | Pan et al. | ........................ | 257/99 |
| 2012/0267673 A1* | 10/2012 | Okabe et al. | .................... | 257/99 |
| 2013/0056785 A1* | 3/2013 | Hwang | ........................... | 257/99 |

* cited by examiner

*Primary Examiner* — Tuan N. Quach
(74) *Attorney, Agent, or Firm* — Birch, Stewart, Kolasch & Birch, LLP

(57) ABSTRACT

Disclosed is a light emitting device. The light emitting device includes a light emitting structure comprising a first area comprising a first semiconductor layer doped with a first dopant, a second semiconductor layer doped with a second dopant and a first active layer, and a second area comprising a third semiconductor layer doped with the first dopant and comprising an exposed region, a fourth semiconductor layer arranged on the third semiconductor layer except for the exposed region and doped with the second dopant and a second active layer, and provided with first and second trenches formed from the fourth semiconductor layer to the first semiconductor layer and separated from each other, a first electrode comprising first and second electrode pad, a second electrode, and a third electrode arranged on the fourth semiconductor layer and comprising a third electrode pad, a fourth electrode pad and a fifth electrode pad.

16 Claims, 26 Drawing Sheets

LIGHT EMITTING DEVICE

CROSS-REFERENCE TO RELATED APPLICATION

This application claims the priority benefit of Korean Patent Application No. 10-2011-0108760, filed on Oct. 24, 2011 in the Korean Intellectual Property Office, the disclosure of which is incorporated herein by reference.

BACKGROUND

1. Field

Embodiments relate to a light emitting device.

2. Description of the Related Art

As one representative example of light emitting devices, light emitting diodes (LEDs) are devices which convert an electrical signal into light, such as infrared light or visible light, using characteristics of a compound semiconductor, and are used in household electric appliances, remote controllers, electronic bulletin boards, displays, various automated machines, etc., and the application range of the LEDs continues to expand.

In general, a small LED is fabricated into a surface mount device type in order to be directly mounted on a printed circuit board (PCB), and thus an LED lamp used as a display device is developed into a surface mount device type. Such a surface mount device may substitute for conventional lamps, and may be used in a light-on/off display producing various colors, a letter indicator, an image display, etc.

Since an LED has general LED rectifying characteristics, if the LED is connected to an AC power supply, the LED is repeatedly turned on/off of directions of current, does not continuously produce light, and may thus be damaged by backward current.

Therefore, research into connection of LEDs directly to an AC power supply is vigorously underway.

SUMMARY

Embodiments provide a light emitting device.

In one embodiment, a light emitting device includes a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and provided with first and second trenches formed from the fourth semiconductor layer to the first semiconductor layer and separated from each other, a first electrode comprising first and second electrode pad disposed on the first semiconductor layer exposed by the first and second trenche, a second electrode disposed on the exposed region of the third semiconductor layer and a hole formed at the exposed region, disposed on the second semiconductor layer, and electrically connected to the second and third semiconductor layers, and a third electrode disposed on the fourth semiconductor layer and comprising a third electrode pad contacting the first and second electrode pad, a fourth electrode pad contacting the first electrode pad and a fifth electrode pad contacting the second electrode pad.

In another embodiment, a light emitting device package includes a light emitting device comprising a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and provided with first and second trenches formed from the fourth semiconductor layer to the first semiconductor layer and separated from each other, a first electrode comprising first and second electrode pad disposed on the first semiconductor layer exposed by the first and second trenche, a second electrode disposed on the exposed region of the third semiconductor layer and a hole formed at the exposed region, disposed on the second semiconductor layer, and electrically connected to the second and third semiconductor layers, and a third electrode disposed on the fourth semiconductor layer and comprising a third electrode pad contacting the first and second electrode pad, a fourth electrode pad contacting the first electrode pad and a fifth electrode pad contacting the second electrode pad, and a body comprising first and second lead frames electrically connected to the light emitting device.

In a further embodiment, a lighting system includes light emitting device packages, each light emitting device package comprising a light emitting device comprising a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and provided with first and second trenches formed from the fourth semiconductor layer to the first semiconductor layer and separated from each other, a first electrode comprising first and second electrode pad disposed on the first semiconductor layer exposed by the first and second trenches, a second electrode disposed on the exposed region of the third semiconductor layer and a hole formed at the exposed region, disposed on the second semiconductor layer, and electrically connected to the second and third semiconductor layers, and a third electrode disposed on the fourth semiconductor layer and comprising a third electrode pad contacting the first and second electrode pad, a fourth electrode pad contacting the first electrode pad and a fifth electrode pad contacting the second electrode pad, and a body comprising first and second lead frames electrically connected to the light emitting device, and a substrate on which the light emitting device packages are disposed.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
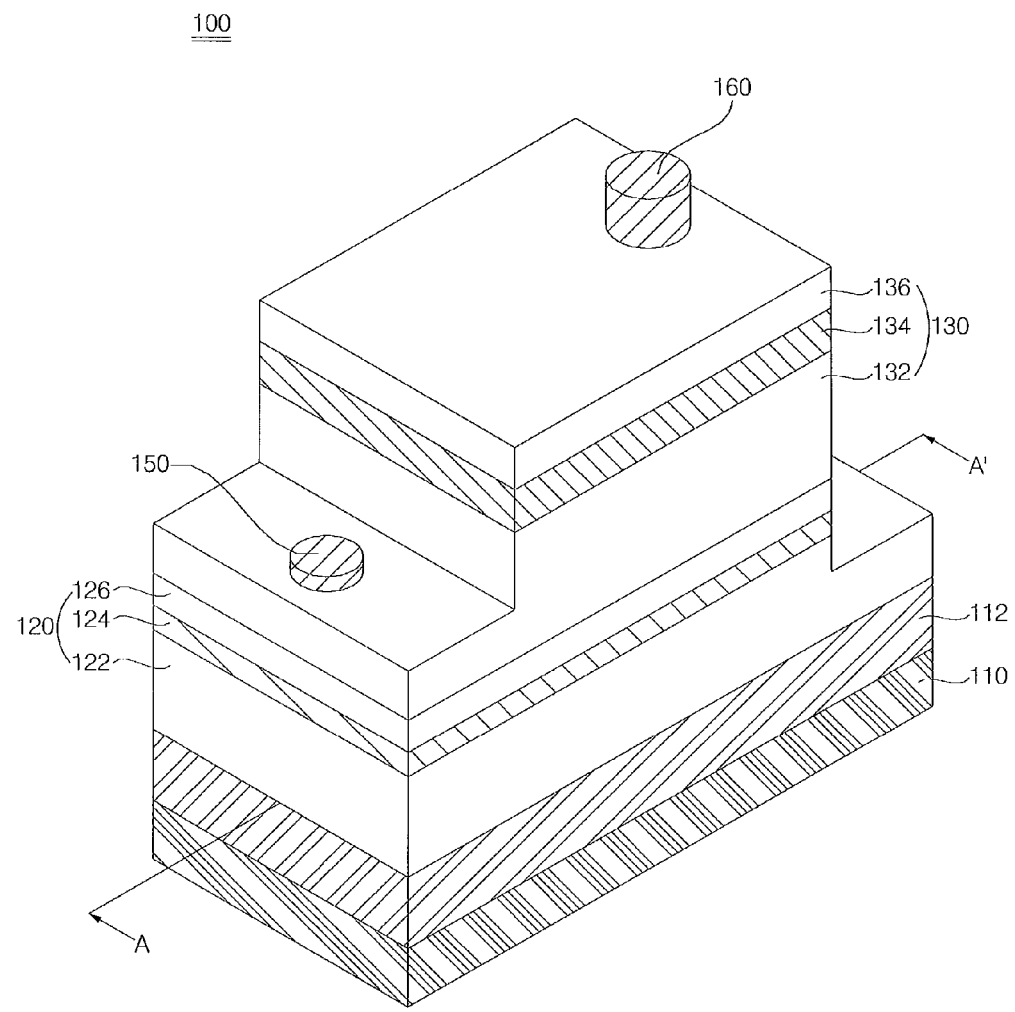
FIG. 1 is a perspective view of a light emitting device in accordance with one embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (comprising technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices of embodiments are based on those shown in the drawings. Unless there is, in the specification, no definition of a reference point to describe angular positional relations in the structures of the light emitting devices, the associated drawings may be referred to.

Figure 2:
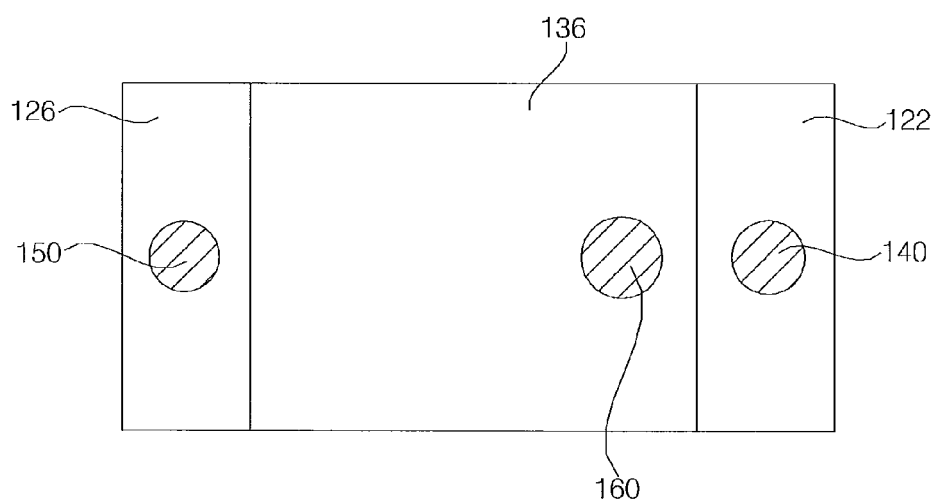
FIG. 2 is a plan view of the light emitting device in accordance with the embodiment.
Figure 3:
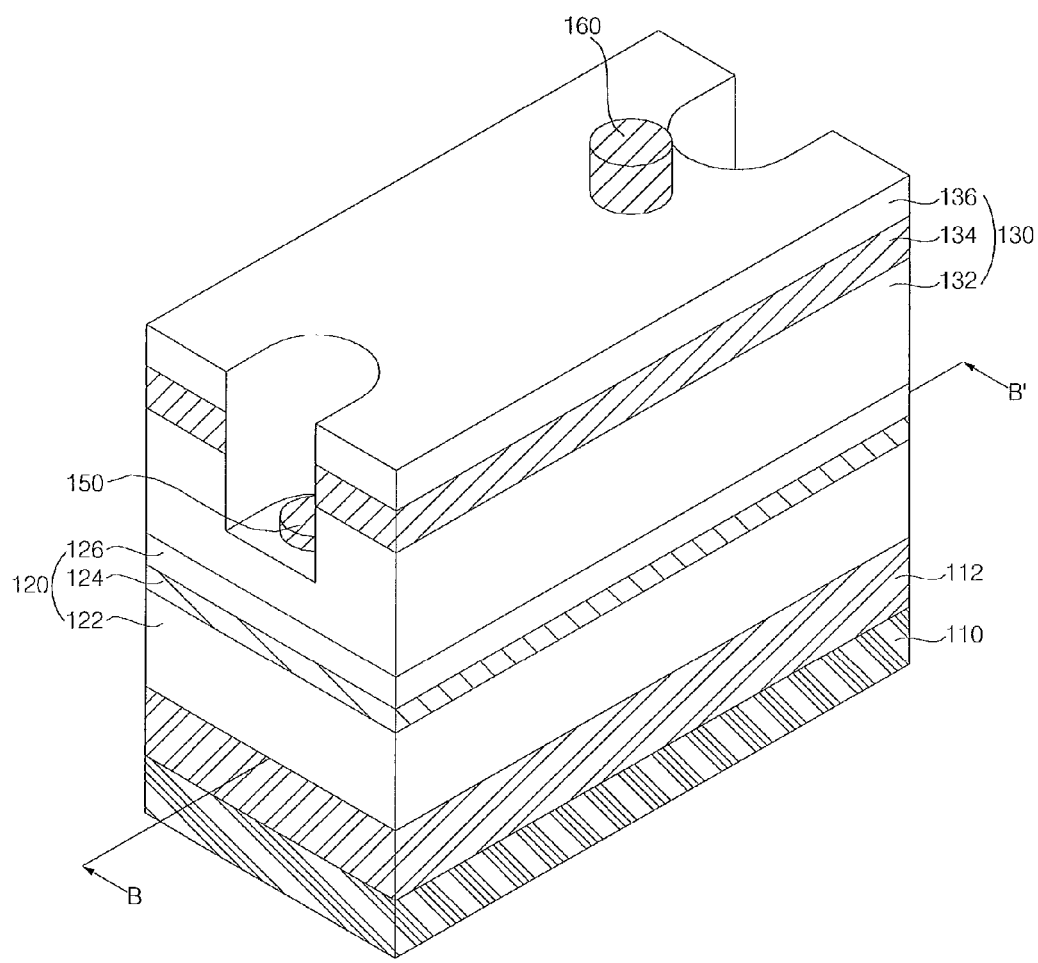
FIG. 3 is a perspective view of a light emitting device in accordance with another embodiment.
Figure 4:
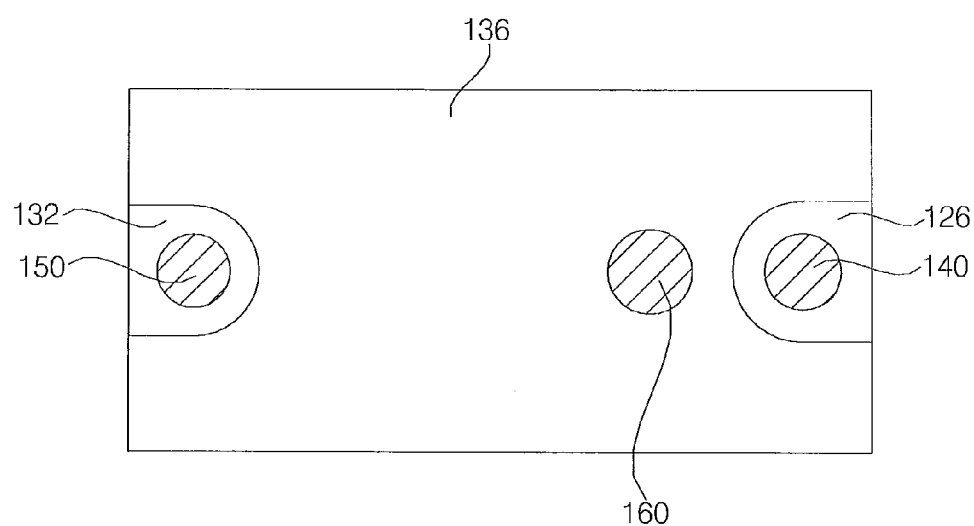
FIG. 4 is a plan view of the light emitting device in accordance with the embodiment.
Figure 5:
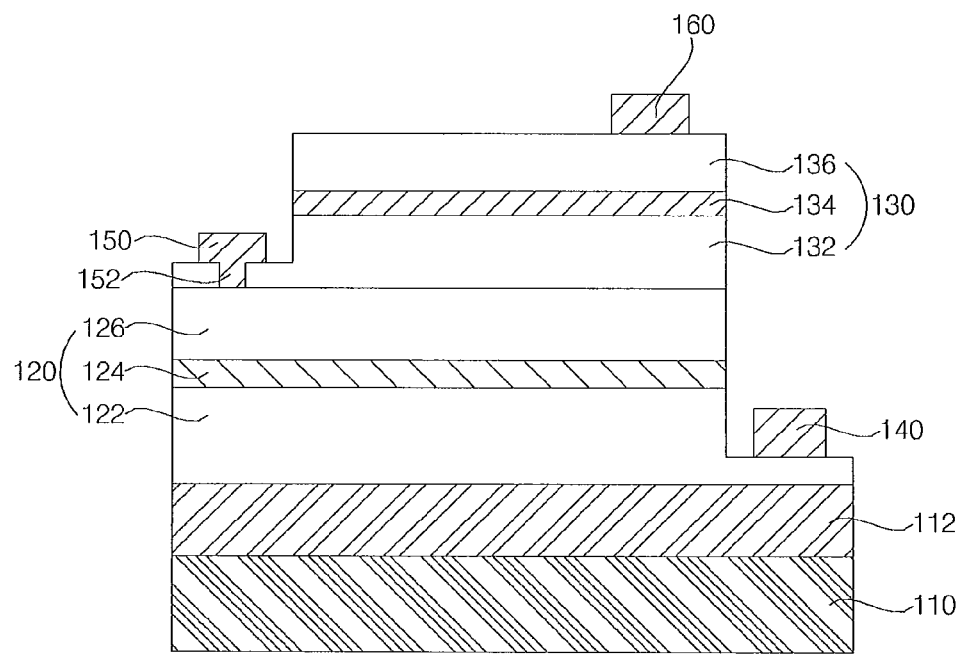
FIG. 5 is a cross-sectional view of a light emitting device in accordance with one embodiment.

FIG. 1 is a perspective view of a light emitting device 100 in accordance with one embodiment, FIG. 2 is a plan view of the light emitting device 100 of FIG. 1, FIG. 3 is a perspective view of a light emitting device 100 in accordance with another embodiment, FIG. 4 is a plan view of the light emitting device 100 of FIGS. 3, and FIGS. 5 to 7 are cross-sectional views of light emitting devices 100 in accordance with embodiments.

With reference to FIGS. 1 and 2, the light emitting device 100 may include a support member 110, a light emitting structure (not shown) comprising a first area 120 disposed on the support member 110 and comprising a first semiconductor layer 122 doped with a first dopant, a second semiconductor layer 126 doped with a second dopant and a first active layer 124 disposed between the first and second semiconductor layers 122 and 126, and a second area 130 disposed on the first area 120 and comprising a third semiconductor layer 132 doped with the first dopant and comprising an exposed region (not shown), a fourth semiconductor layer 136 disposed on the third semiconductor layer 132 except for the exposed region and doped with the second dopant and a second active layer 134 disposed between the third and fourth semiconductor layers 132 and 136, a first electrode 140 electrically connected to the first semiconductor layer 122, a second electrode 150 disposed on a hole (not shown) formed at the exposed region, disposed on the third semiconductor layer 132 and electrically connected to the second and third semiconductor layers 126 and 132, and a third electrode 160 disposed on the fourth semiconductor layer 136.

The support member 110 may be formed of a light transmitting material, for example, one selected from the group consisting of sapphire ($Al_2O_3$), GaN, ZnO and AlO, but the disclosure is not limited thereto. Further, the support member 110 may be a SiC substrate having higher thermal conductivity than sapphire ($Al_2O_3$).

A buffer layer 112 to reduce lattice mismatch between the support member 110 and the first area 120 and to facilitate growth of a semiconductor layer may be located on the upper surface of the support member 110. The buffer layer 112 may be formed under a low-temperature atmosphere, and may be formed of a material which may reduce a lattice constant difference between the semiconductor layer and the support member 110. For example, the buffer layer 112 may be formed of one selected from the group consisting of GaN, InN, AlN, AlInN, InGaN, AlGaN and InAlGaN, but the disclosure is not limited thereto. The buffer layer 112 may be grown to produce single crystals on the support member 110, and the buffer layer 112 having single crystals may improve crystallinity of the first area 120 grown on the buffer layer 112.

The first area 120 comprising the first semiconductor layer 122, the active layer 124 and the second semiconductor layer 126 may be formed on the buffer layer 112.

The first semiconductor layer 122 may be located on the buffer layer 112. The first semiconductor layer 122 may be doped with a first conductivity-type dopant, and the first conductivity-type dopant may be an N-type dopant. For example, the first semiconductor layer 122 may be an N-type semiconductor layer, and may provide electrons to the first active layer 124. The first semiconductor layer 122 may be a nitride-based semiconductor layer. For example, the first semiconductor layer 122 may be formed of a semiconductor material having a formula of $In_xAl_yGa_{1-x-y}N$ ($0 \leq x \leq 0$, $0 \leq x+y \leq 1$), for example, one selected from the group consisting of GaN, AlN, AlGaN, InGaN, InN, InAlGaN and AlInN. Further, the first semiconductor layer 122 may be a zinc oxide-based semiconductor layer. For example, the first semiconductor layer 122 may be formed of a semiconductor material having a formula of $In_xAl_yZn_{1-x-y}O$ ($0 \leq x \leq 1$, $0 \leq y \leq 1$ $0 \leq x+y \leq 1$), for example, one selected from the group consisting of ZnO, AlO, AlZnO, InZnO, InO, InAlZnO and AlInO, but the disclosure is not limited thereto. Further, the first semiconductor layer 122 may be doped with an N-type dopant, such as Si, Ge or Sn.

Further, an undoped layer (not shown) may be formed on the lower surface of the first semiconductor layer 122, but the disclosure is not limited thereto. The undoped layer (not shown) serves to improve crystallinity of the first semiconductor layer 122, and may be the same as the first semiconductor layer 122 except that the undoped layer (not shown) is not doped with the N-type dopant and thus has lower electrical conductivity than the first semiconductor layer 122.

The first active layer 124 may be formed on the first semiconductor layer 122. The first active layer 124 may be formed in a single quantum well structure, a multi-quantum well (MQW) structure, a quantum wire structure or a quantum dot structure using a group III-V compound semiconductor material.

If the first active layer 124 is formed in a quantum well structure, the first active layer 124 may be formed in a multi-quantum well structure. Further, the first active layer 124 may be a nitride-based or zinc oxide-based semiconductor layer. For example, the first active layer 124 may be formed in a single quantum well structure or a multi-quantum well structure comprising well layers having a formula of $In_xAl_yGa_{1-x-y}N$ ($0 \leq x \leq 1$, $0 \leq y \leq 1$ $0 \leq x+y \leq 1$) and barrier layers having a formula of $In_aAl_bGa_{1-a-b}N$ ($0 \leq a \leq 1$, $0 \leq b \leq 1$ $0 \leq a+b \leq 1$). The well layers may have a formula of $In_xAl_yZn_{1-x-y}O$ ($0 \leq x \leq 1$, $0 \leq y \leq 1$ $0 \leq x+y \leq 1$) and the barrier layers may have a formula of $In_aAl_bZn_{1-a-b}O$ ($0 \leq a \leq 1$, $0 \leq b \leq 1$ $0 \leq a+b \leq 1$), but the disclosure is not limited thereto. The well layers may be formed of a material having a lower band gap than the band gap of the barrier layers.

If the first active layer 124 has a multi-quantum well structure, the respective well layers (not shown) and barrier layers (not shown) may have different compositions, different thicknesses and different band gaps, and a detailed description thereof will be given later.

A conductive clad layer (not shown) may be formed on the upper surface and/or the lower surface of the first active layer 124. The conductive clad layer (not shown) may be formed of an AlGaN-based semiconductor or an AlZnO-based semiconductor and have a higher band gap than the band gap of the first active layer 124.

The second semiconductor layer 126 may be doped with a second conductivity-type dopant, and the second conductivity-type dopant may be a P-type dopant. For example, the second semiconductor layer 126 may be a P-type semiconductor layer so as to inject holes into the first active layer 124. The second semiconductor layer 126 may be a nitride-based semiconductor layer. For example, the second semiconductor layer 126 may be formed of a semiconductor material having a formula of $In_xAl_yGa_{1-x-y}N$ ($0 \leq x \leq 1$, $0 \leq y \leq 1$ $0 \leq x+y \leq 1$), for example, one selected from the group consisting of GaN, AlN, AlGaN, InGaN, InN, InAlGaN and AlInN. Further, the second semiconductor layer 126 may be a zinc oxide-based semiconductor layer. For example, the second semiconductor layer 126 may be formed of a semiconductor material having a formula of $In_xAl_yZn_{1-x-y}O$ ($0 \leq x \leq 1$, $0 \leq y \leq 1$ $0 \leq x+y \leq 1$), for example, one selected from the group consisting of ZnO, AlO, AlZnO, InZnO, InO, InAlZnO and AlInO, but the disclosure is not limited thereto. Further, the second semiconductor layer 126 may be doped with a P-type dopant, such as Mg, Zn, Ca, Sr and Ba.

The above-described first semiconductor layer 122, first active layer 124 and second semiconductor layer 126 may be formed through metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or sputtering, but the disclosure is not limited thereto.

Further, doping concentrations of the conductive dopants within the first semiconductor layer 122 and the second semiconductor layer 126 may be uniform or non-uniform. That is, the plural semiconductor layers may have various doping concentration distributions, but the disclosure is not limited thereto.

Further, the first semiconductor layer 122 may be a P-type semiconductor layer, the second semiconductor layer 126 may be an N-type semiconductor layer, and a semiconductor layer (not shown) comprising an N-type or P-type semiconductor layer may be formed on the second semiconductor layer 126. Thereby, the first area 120 may have at least one of np, pn, npn, and pnp junction structures.

The second area 130 may be formed on the first area 120.

The second area 130 may include the third semiconductor layer 132, the active layer 134 and the fourth semiconductor layer 136.

The third semiconductor layer 132 may be located on the second semiconductor layer 126. The third semiconductor layer 132 may be doped with the first conductivity-type dopant in the same manner as the first semiconductor layer 122. For example, if the first semiconductor layer 122 is doped with the first conductivity-type dopant, the third semiconductor layer 132 may be doped with the first conductivity-type dopant. Here, the first conductivity-type dopant may be an N-type dopant. For example, the third semiconductor layer 132 may be an N-type semiconductor layer, and may provide electrons to the second active layer 134.

The third semiconductor layer 132 may be a nitride-based semiconductor layer. For example, the third semiconductor layer 132 may be formed of a semiconductor material having a formula of $In_xAl_yGa_{1-x-y}N$ ($0 \leq x \leq 1$, $0 \leq y \leq 1$ $0 \leq x+y \leq 1$), for example, one selected from the group consisting of GaN, AlN, AlGaN, InGaN, InN, InAlGaN and AlInN. Further, the third semiconductor layer 132 may be a zinc oxide-based semiconductor layer. For example, the third semiconductor layer 132 may be formed of a semiconductor material having a formula of $In_xAl_yZn_{1-x-y}O$ ($0 \leq x \leq 1$, $0 \leq y \leq 1$ $0 \leq x+y \leq 1$), for example, one selected from the group consisting of ZnO, AlO, AlZnO, InZnO, InO, InAlZnO and AlInO, but the disclosure is not limited thereto. Further, the third semiconductor layer 132 may be doped with an N-type dopant, such as Si, Ge or Sn.

The second active layer 134 may be formed on the third semiconductor layer 132. The second active layer 132 may be formed in a single quantum well structure, a multi-quantum well (MQW) structure, a quantum wire structure or a quantum dot structure using a group III-V compound semiconductor material.

The second active layer 134 may be formed in a quantum well structure. Further, the second active layer 134 may be a nitride-based or zinc oxide-based semiconductor layer. For example, the second active layer 134 may be formed in a single quantum well structure or a multi-quantum well structure comprising well layers having a formula of $In_xAl_yGa_{1-x-y}N$ ($0 \leq x \leq 1$, $0 \leq y \leq 1$ $0 \leq x+y \leq 1$) and barrier layers having a formula of $In_aAl_bGa_{1-a-b}N$ ($0 \leq a \leq 1$, $0 \leq b \leq 1$ $0 \leq a+b \leq 1$). The well layers may have a formula of $In_xAl_yZn_{1-x-y}O$ ($0 \leq x \leq 1$, $0 \leq y \leq 1$ $0 \leq x+y \leq 1$) and the barrier layers may have a formula of $In_aAl_bZn_{1-a-b}O$ ($0 \leq a \leq 1$, $0 \leq b \leq 1$ $0 \leq a+b \leq 1$), but the disclosure is not limited thereto. The well layers may be formed of a material having a lower band gap than the band gap of the barrier layers.

If the second active layer 134 has a multi-quantum well structure, the respective well layers (not shown) may have different compositions and different band gaps, and a detailed description thereof will be given later.

A conductive clad layer (not shown) may be formed on the upper surface and/or the lower surface of the second active layer 134. The conductive clad layer (not shown) may be formed of an AlGaN-based semiconductor or an AlZnO-based semiconductor and have a higher band gap than the band gap of the second active layer 134.

The fourth semiconductor layer 136 may be doped with the second conductivity-type dopant in the same manner as the second semiconductor layer 126. For example, if the second semiconductor layer 122 is doped with the second conductivity-type dopant, the fourth semiconductor layer 136 may be doped with the second conductivity-type dopant. Here, the second conductivity-type dopant may be a P-type dopant. For example, the fourth semiconductor layer 136 may be a P-type semiconductor layer so as to inject holes into the second active layer 134.

The fourth semiconductor layer 136 may be a nitride-based semiconductor layer. For example, the fourth semiconductor layer 136 may be formed of a semiconductor material having a formula of $In_xAl_yGa_{1-x-y}N$ ($0 \leq x \leq 1$, $0 \leq y \leq 1$ $0 \leq x+y \leq 1$), for example, one selected from the group consisting of GaN, AlN, AlGaN, InGaN, InN, InAlGaN and AlInN. Further, the fourth semiconductor layer 136 may be a zinc oxide-based semiconductor layer. For example, the fourth semiconductor layer 136 may be formed of a semiconductor material having a formula of $In_xAl_yZn_{1-x-y}O$ ($0 \leq x \leq 1$, $0 \leq y \leq 1$ $0 \leq x+y \leq 1$), for example, one selected from the group consisting of ZnO, AlO, AlZnO, InZnO, InO, InAlZnO and AlInO, but the disclosure is not limited thereto. Further, the fourth semiconductor layer 136 may be doped with a P-type dopant, such as Mg, Zn, Ca, Sr and Ba.

The above-described third semiconductor layer 132, second active layer 134 and fourth semiconductor layer 136 may be formed through metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE) or sputtering, but the disclosure is not limited thereto.

Further, doping concentrations of the conductive dopants within the third semiconductor layer 132 and the fourth semiconductor layer 136 may be uniform or non-uniform. That is, the plural semiconductor layers may have various doping concentration distributions, but the disclosure is not limited thereto.

Further, the third semiconductor layer 132 may be a P-type semiconductor layer, the fourth semiconductor layer 136 may be an N-type semiconductor layer, and a semiconductor layer (not shown) comprising an N-type or P-type semiconductor layer may be formed on the fourth semiconductor layer 136. Thereby, the second area 130 may have at least one of np, pn, npn, and pnp junction structures.

The first area 120 and the second area 130 may be formed integrally, for example, may be sequentially grown through one growth process, but the disclosure is not limited thereto. Further, the first area 120 and the second area 130 may be formed of the same material, but the disclosure is not limited thereto. Further, since the first and second light emitting structures may respectively have at least one of np, pn, npn and pnp junction structures, as described above, the light emitting device 100 may have at least one of npnp, nppn, npnpn, npppnp, pnnp, pnpn, pnnpn, pnpnp, npnnp, npnpn, npnnpn, npnpnp, pnpnp, pnppn, pnpnpn and pnppnp junction structures, but the disclosure is not limited thereto.

Light generated from the first area 120 and light generated from the second area 130 may have different wavelengths and different amounts. For example, the amount of light generated from the first area 120 may be greater than the amount of light generated from the second area 130 in consideration of loss generated when light generated from the first area 120 passes through the second area 130.

Further, the first area 120 and the second area 130 may have different structures, thicknesses, compositions and sizes and be formed of different materials, but the disclosure is not limited thereto.

Further, although FIGS. 1 to 7 illustrate the light emitting device 100 as comprising the first area 120 and the second area 130 formed on the first area 120, the disclosure is not limited thereto. That is, the light emitting device 100 may include at least two areas (not shown).

The first electrode 140 may be formed on at least one surface of the first semiconductor layer 122. For example, the first electrode 140 may be formed at a region of the first semiconductor layer 122 which is exposed by removing a part of each of the first and second areas 120 and 130. That is, as shown in FIGS. 1 to 7, the first semiconductor layer 122 may include an upper surface facing the first active layer 124 and a lower surface facing the support member 110, the upper surface of the first semiconductor layer 122 may include at least one exposed region, and the first electrode 140 may be disposed on the exposed region of the upper surface of the first semiconductor layer 122.

As shown in FIGS. 1 to 7, the first and second areas 120 and 130 may include first and second trenches (not shown) formed by removing at least one region of the first and second areas 120 and 130 to expose a part of the first semiconductor layer 122. Parts of the first semiconductor layer 122 may be exposed through the first and second trenches, and the first electrode 140 may be disposed at the exposed region. Here, the first and second trenches may be formed at one side region of the light emitting device 100, as shown in FIGS. 1 to 7, but the disclosure is not limited thereto. That is, the first and second trenches may be formed at a corner region, a central region or any random region, and the number of the first and second trenches is not limited.

The second electrode 150 may be formed at at least one region of the second semiconductor layer 126 and the third semiconductor layer 132. For example, one region of the third semiconductor layer 132 may be exposed by removing at least one region of the second area 130, and the second electrode 150 may be formed at the exposed region. That is, as shown in FIGS. 1 to 7, the third semiconductor layer 132 may include an upper surface facing the fourth semiconductor layer 136 and a lower surface facing the support member 110, the upper surface of the third semiconductor layer 132 may include at least one exposed region, and the second electrode 150 may be disposed on the exposed region of the upper surface of the third semiconductor layer 132. Further, a hole 152 is formed through the region of the third semiconductor layer 132, thereby exposing a part of the second semiconductor layer 126. The second electrode 150 may be connected to the second semiconductor layer 126 through the hole 152 of the third semiconductor layer 132.

Further, as shown in FIGS. 1 to 7, the second area 130 may include a recess 190 (도면에 도면 번호 미도시) formed by removing at least one region of the second area 130 so as to expose a part of the third semiconductor layer 132. Here, the recess 190 may be formed at one side region of the light emitting device 100, as shown in FIGS. 1 to 7, but the disclosure is not limited thereto. That is, the recess 190 may be formed at a corner region, a central region or any random region, and the number of the recess 190 is not limited.

The third electrode 160 may be formed on the fourth semiconductor layer 136. The third electrode 160 may be formed at at least one region of the fourth semiconductor layer 136, such as a central or corner region of the fourth semiconductor layer 136, but the disclosure is not limited thereto.

In order to expose parts of the first semiconductor layer 122, the second semiconductor layer 126 and the third semiconductor layer 132, a designated etching method may be used, but the disclosure is not limited thereto. As the etching method, a wet etching method or a dry etching method may be used.

For example, the etching method may be a MESA etching method. That is, first MESA etching of one region of each of the first area 120 and the second area 130 may be carried out so as to expose one region of the first semiconductor layer 122, and second MESA etching of one region of the second area 130 may be carried out so as to expose one region of the third semiconductor layer 132.

Since the first electrode 140 is formed on the first semiconductor layer 122, the second electrode 150 is formed on the second and third semiconductor layers 126 and 132, and the third electrode 160 is formed on the fourth semiconductor layer 136, the first to third electrodes 140, 150 and 160 may be formed in the same direction.

Figure 6:
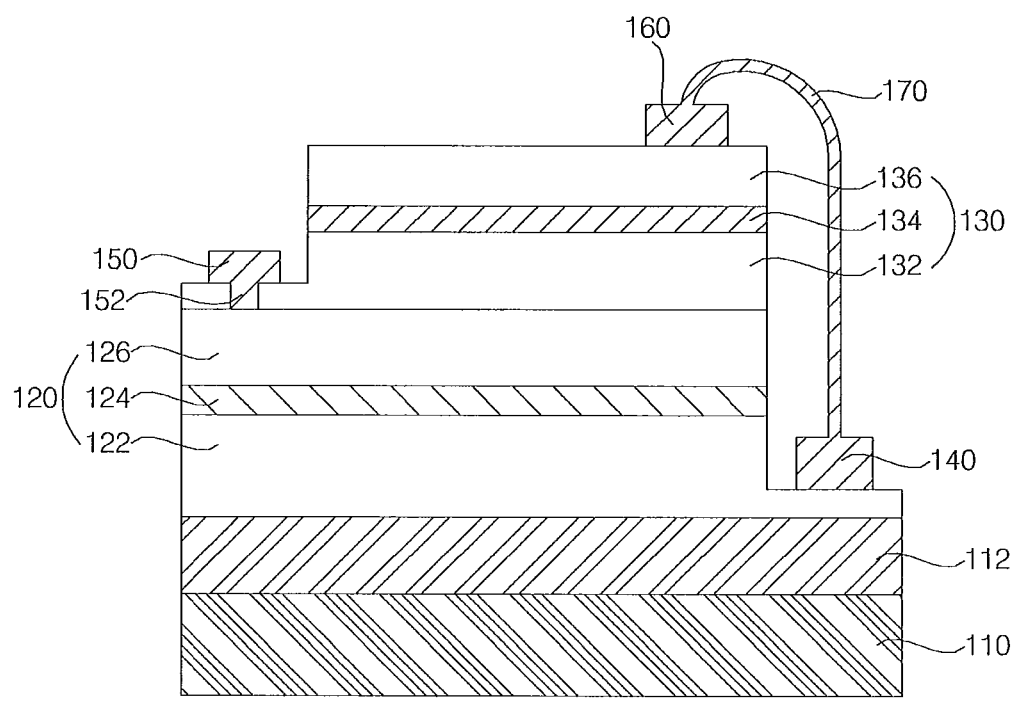
FIG. 6 is a cross-sectional view of a light emitting device in accordance with another embodiment.
Figure 7:
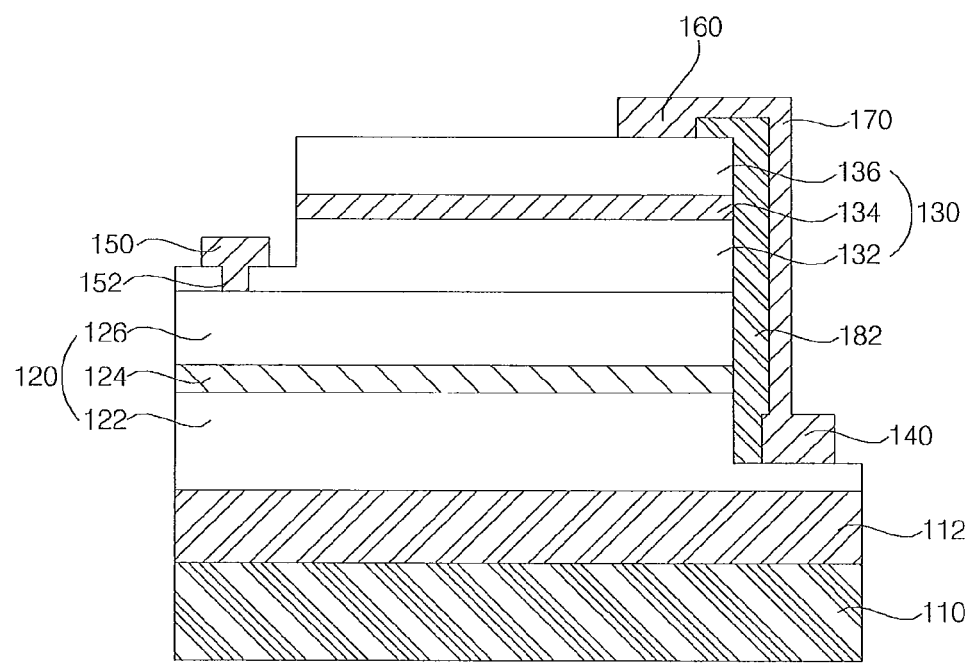
FIG. 7 is a cross-sectional view of a light emitting device in accordance with another embodiment.

The first electrode 140 and the third electrode 160 may be interconnected. For example, as shown in FIGS. 6 and 7, the first electrode 140 and the third electrode 160 may be interconnected through a designated conductive connection member 170. The conductive connection member 170 may be a wire, as shown in FIG. 6 or be a designated conductive structure, as shown in FIG. 7, but the disclosure is not limited thereto. For example, the conductive connection member 170 may be connected to the first electrode 140 and the third electrode 160 through wire-bonding or soldering or may be integrated with the first and third electrodes 140 and 160 as one member, but the disclosure is not limited thereto.

In order to prevent unnecessary electrical short between the conductive connection member 170 and the first and second areas 120 and 130, insulating members 172 may be formed between the conductive connection member 170 and the first and second areas 120 and 130, but the disclosure is not limited thereto.

The first electrode 140 and the third electrode 160 are interconnected, and thus power of the same polarity may be applied to the first semiconductor layer 122 and the fourth semiconductor layer 136 through the first electrode 140 and the third electrode 160.

Further, the second electrode 150 is formed on the second semiconductor layer 126 and the third semiconductor layer 132, and thus power of the same polarity may be applied to the second semiconductor layer 126 and the third semiconductor layer 132.

Arrangement of the first to third electrodes 140, 150 and 160 may be random, and a detailed description thereof will be given later.

The first to third electrodes 140, 150 and 160 may be formed of a conductive material, for example, one metal selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof, or may be formed of the above metal and a light transmitting conductive material, such as IZO, IZTO, IAZO, IGZO, IGTO, AZO or ATO, and the disclosure is not limited thereto.

Further, at least one of the first and second electrodes 140 and 150 may have a single layer structure or a multi-layer structure, but the disclosure is not limited thereto.

Hereinafter, operation of the light emitting device 100 in accordance with the embodiment will be described with reference to FIGS. 8 to 10. Hereinafter, it will be assumed that the first and third semiconductor layers 122 and 132 are N-type semiconductor layers and the second and fourth semiconductor layers 126 and 136 are P-type semiconductor layers.

Figure 8:
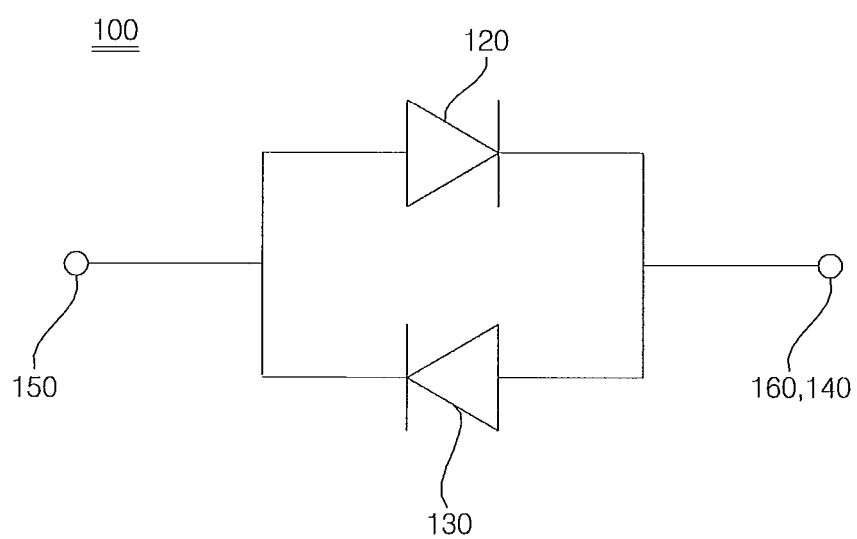
FIG. 8 is a circuit diagram of a light emitting device in accordance with one embodiment.

FIG. 8 is a circuit diagram of the light emitting device 100 in accordance with the embodiment.

As described above, the first electrode 140 may be connected to the first semiconductor layer 122, the second electrode 150 may be connected to the second semiconductor layer 126 and the third semiconductor layer 132, the third electrode 160 may be connected to the fourth semiconductor layer 136, and the first electrode 140 and the third electrode 160 may be interconnected. Here, if the first and third semiconductor layers 122 and 132 are doped with the first conductivity-type dopant and the second and fourth semiconductor layers 126 and 136 are doped with the second conductivity-type dopant, the light emitting device 100 in accordance with the embodiment may have a circuit structure in which two light emitting diodes are connected in a reverse parallel structure, as shown in FIG. 8.

Figure 9:
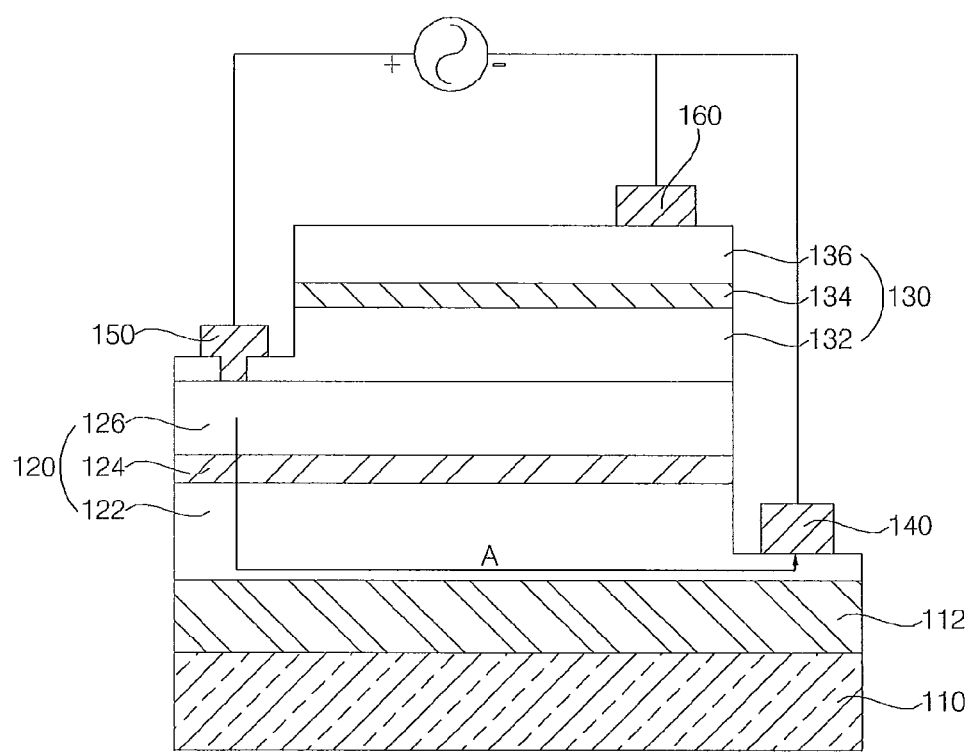
FIG. 9 is a view illustrating driving of the light emitting device in accordance with the embodiment when forward voltage is applied to the light emitting device.

FIG. 9 is a view illustrating driving of the light emitting device 100 in accordance with the embodiment when forward bias is applied to the light emitting device 100.

As shown in FIG. 9, in the case of an AC power supply, positive voltage (+) may be supplied to the second electrode 150 and negative voltage (−) may be supplied to the first and third electrodes 150 and 160. Thereby, power in a first direction may be applied to the light emitting device 100.

Here, a first current path A flowing from the second semiconductor layer 126 to the first semiconductor layer 124 via the first active layer 124 is formed in the first area 120. Since the second semiconductor layer 126 is the P-type semiconductor layer and the first semiconductor layer 122 is the N-type semiconductor layer, as described above, the first area 120 may be turned on and thus the first active layer 124 may generate light.

Further, in the second area 130, positive voltage (+) is supplied to the third semiconductor layer 132 and negative voltage (−) is supplied to the fourth semiconductor layer 136, and thus backward bias is applied to the second area 130. Therefore, a current path is not generated and the second area 130 is turned off.

Figure 10:
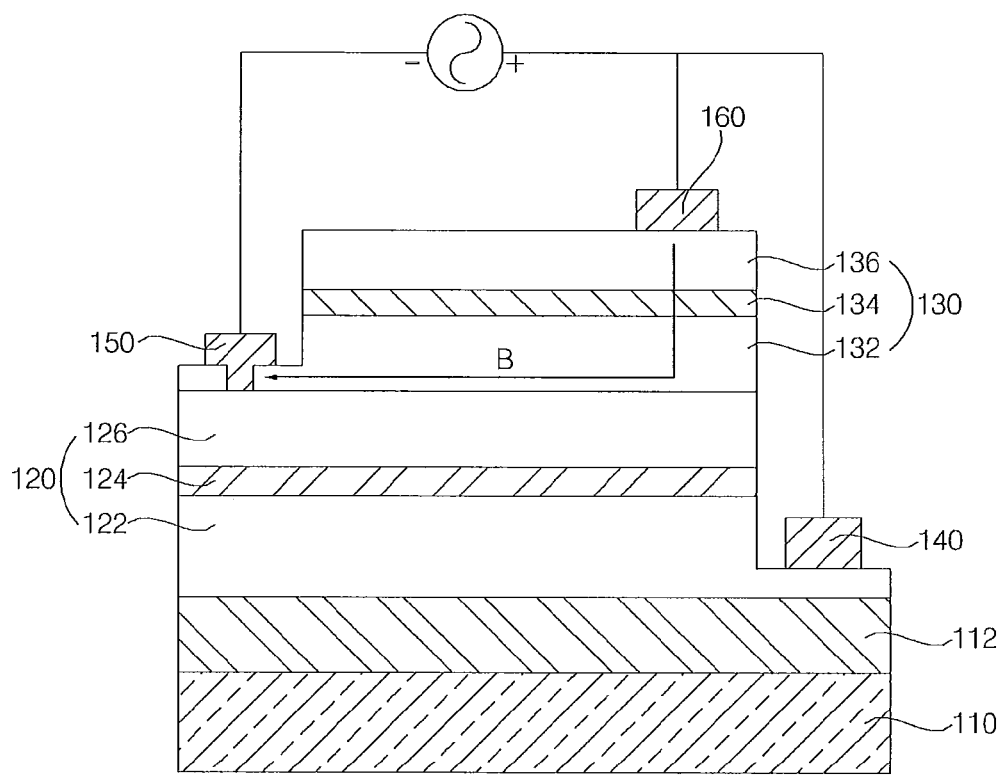
FIG. 10 is a view illustrating driving of the light emitting device in accordance with the embodiment when backward voltage is applied to the light emitting device.

FIG. 10 is a view illustrating driving of the light emitting device 100 in accordance with the embodiment when backward bias is applied to the light emitting device 100.

As shown in FIG. 10, negative voltage (−) may be supplied to the second electrode 150 and positive voltage (+) may be supplied to the first and third electrodes 150 and 160. Thereby, power in a second direction may be applied to the light emitting device 100. Here, the second direction may be opposite to the above-described first direction.

Here, a second current path B flowing from the fourth semiconductor layer 136 to the third semiconductor layer 134 via the second active layer 134 is formed in the second area 130. Since the fourth semiconductor layer 136 is the P-type semiconductor layer and the third semiconductor layer 132 is the N-type semiconductor layer, as described above, the second area 130 may be turned on and thus the second active layer 134 may generate light.

Further, in the first area 120, positive voltage (+) is supplied to the first semiconductor layer 122 and negative voltage (−) is supplied to the second semiconductor layer 126, and thus backward bias is applied to the first area 110. Therefore, a current path is not generated and the first area 110 is turned off.

As shown in FIGS. 9 and 10, the light emitting device 100 in accordance with the embodiment may emit light in the case of both forward bias and backward bias of an AC power supply.

Therefore, when an AC power supply is used as a power supply of the light emitting device 100, a separate rectification circuit or plural light emitting devices are not required, and thus economic efficiency of the light emitting device 100 in accordance with the embodiment or an apparatus using the light emitting device 100 in accordance with the embodiment may be improved.

Further, the light emitting device 100 of a single chip type may emit light in the case of both forward bias and backward bias, and thus light emitting efficiency of the light emitting device 100 per unit area may be improved.

Further, current paths may be respectively formed in the case of both forward bias and backward bias, and thus damage to the light emitting device 100 due to ESD may be prevented and a separate ESD protection device may be omitted. Further, a light emitting device package or a lighting apparatus using the light emitting device 100 in accordance with the embodiment does not include an ESD device, thus having a small volume and preventing optical loss due to the ESD device.

Further, since the light emitting device 100 includes the light emitting structures respectively generating light in the case of backward bias and forward bias and the respective light emitting structures are formed integrally, the first and second areas 120 and 130 may be grown through a single process. Therefore, economic efficiency in a fabrication process of the light emitting device 100 may be improved.

Figure 11:
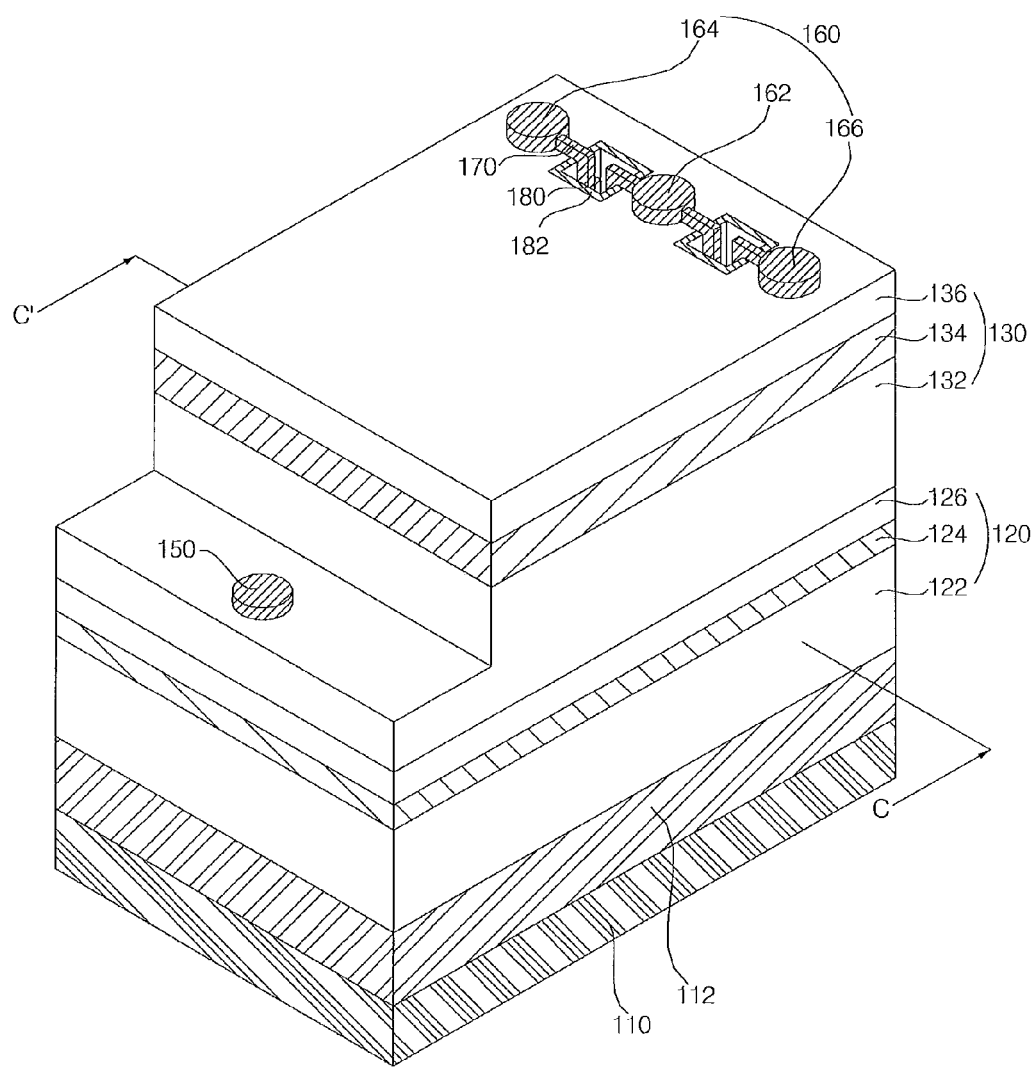
FIG. 11 is a perspective view of a light emitting device in accordance with another embodiment.
Figure 12:
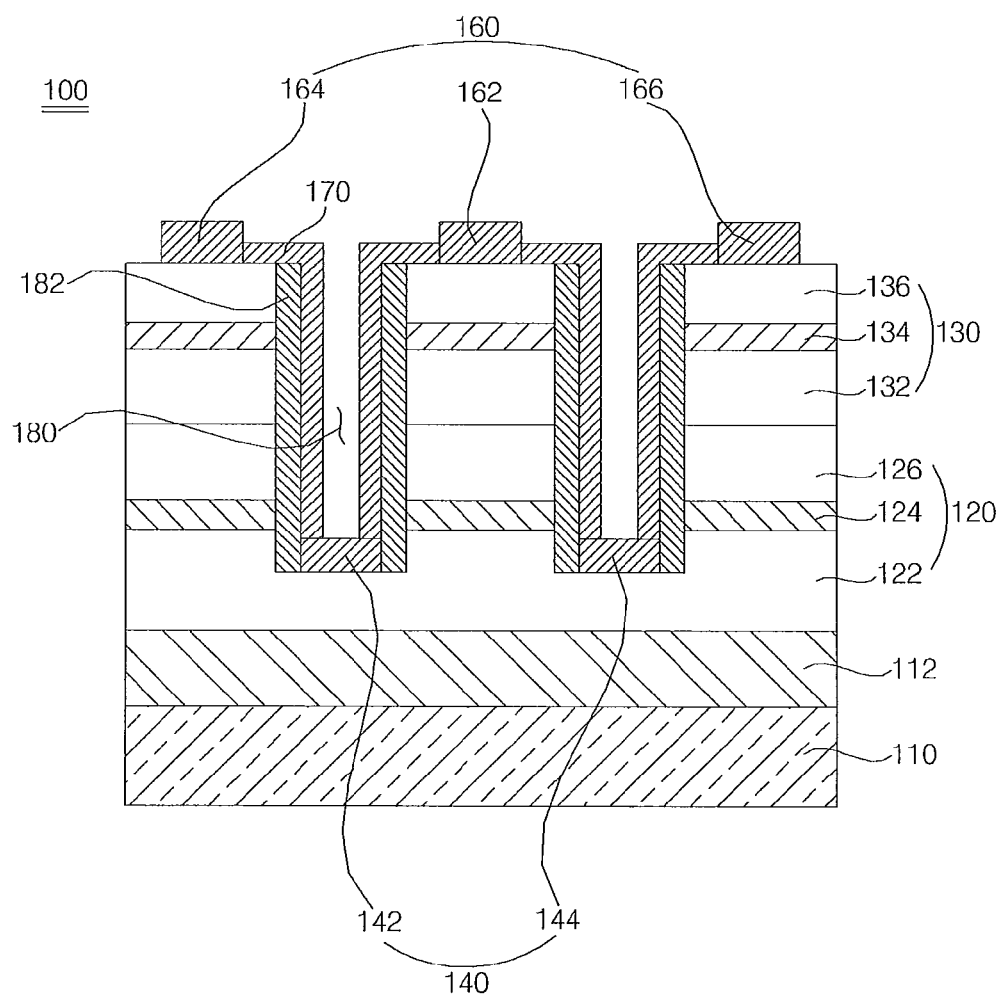
FIG. 12 is a cross-sectional view of the light emitting device in accordance with the embodiment.
Figure 13:
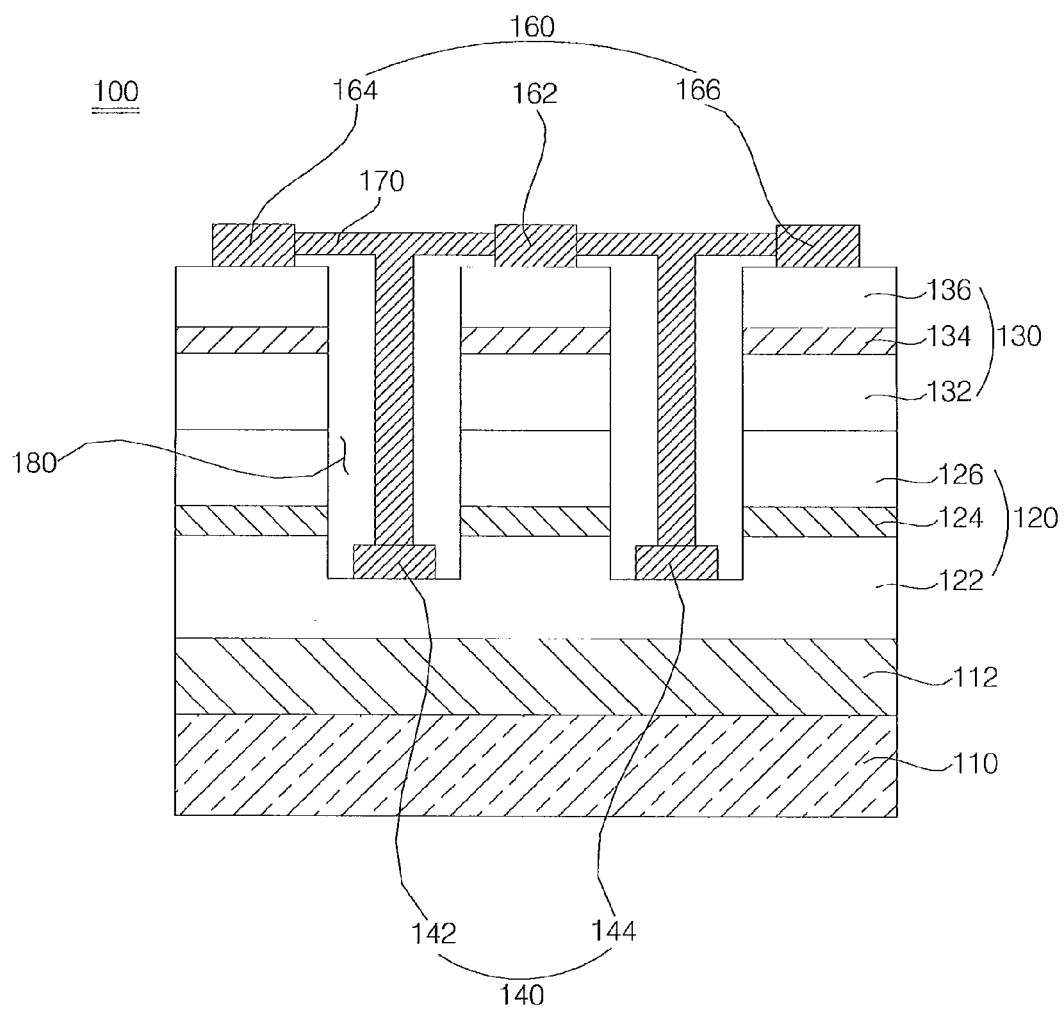
FIG. 13 is a cross-sectional view of the light emitting device in accordance with the embodiment.
Figure 14:
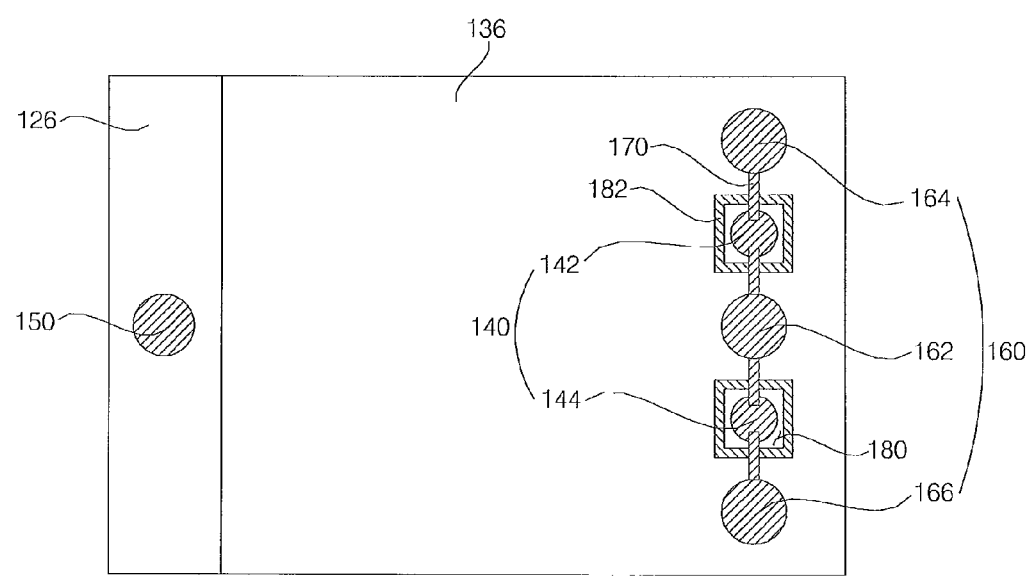
FIG. 14 is a plan view of the light emitting device in accordance with the embodiment.
Figure 15:
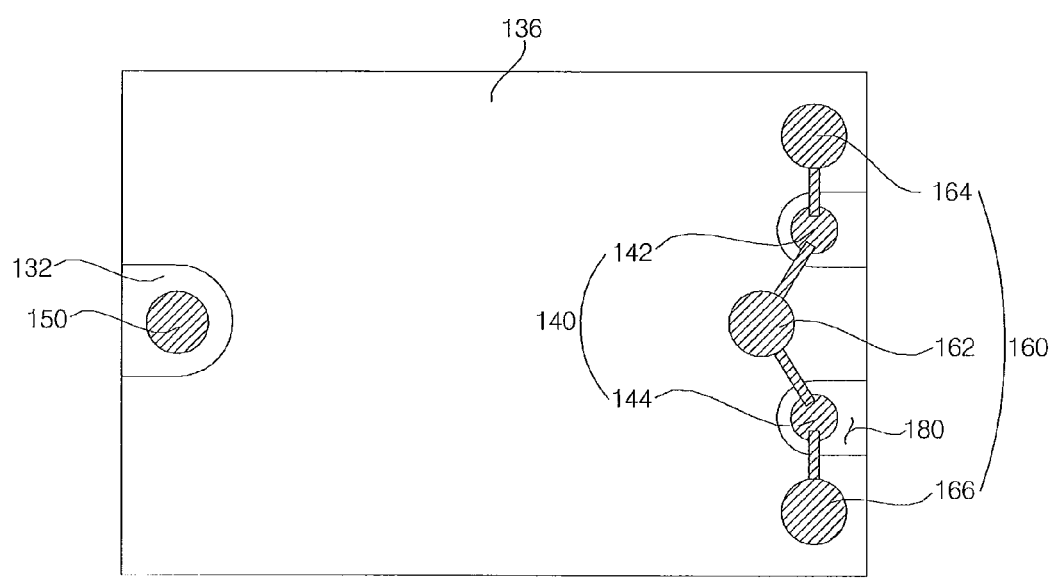
FIG. 15 is a plan view of the light emitting device in accordance with the embodiment.

FIG. 11 is a perspective view of a light emitting device 100 in accordance with another embodiment, FIGS. 12 and 13 are cross-sectional views taken along the line C-C' of FIG. 11, and FIGS. 14 and 15 are plan views of the light emitting device 100 in accordance with the embodiment.

With reference to FIGS. 11 to 15, the light emitting device 100 in accordance with the embodiment may include first and second trenche 180 formed to expose at least one region of a first semiconductor layer 122, a first electrode 140 may be disposed at the exposed region, and the first electrode 140 and a third electrode 160 may be interconnected through conductive connection members 170.

The first and second trenches 180 may be formed at at least one region of first and second areas 120 and 130. The first and second trenches 180 may be formed by removing at least one region of the first and second areas 120 and 130 so as to expose the first semiconductor layer 122. The first and second trenche 180 may be formed by punching at least one region of the first and second areas 120 and 130 or etching the first and second areas 120 and 130 through a designated method, but the disclosure is not limited thereto. Although the first and second trenches 180 may be formed by punching at least one region of the light emitting device 100, as shown in FIGS. 11 to 14, or removing at least one region of the edge of the light emitting device 100, as shown in FIG. 15, the first and second trenches 180 may be formed at random positions. Further, the first and second trenches 180 may have any random shape, such as a circle or a polygon, and the disclosure is not limited as to the shapes of the first and second trenches 180, as shown in FIGS. 11 to 15. Further, the disclosure is not limited as to the number of the first and second trenches 180, as shown in FIGS. 11 to 15, and the first and second trenches 180 may be formed in random number.

At least one region of the first semiconductor layer 122 may be exposed upwards through the first and second trenches 180, and the first electrode 140 may be disposed at the exposed region.

The first electrode 140 may include a first electrode pad 142 and a second electrode pad 144 disposed in the first and second trenches 180. The first and second electrode pad 142 and 144 are disposed in the first and second trenches 180 and are formed on the first semiconductor layer 122, thus supplying power to the first semiconductor layer 122.

The third electrode 160 may be formed on the fourth semiconductor layer 136, and, for example, may include third to fifth electrode pads 162, 164 and 166, as shown in FIGS. 11 to 15. The disclosure is not limited as to the shape of the respective electrode pads 162, 164 and 166, as shown in FIGS. 11 to 15. The respective electrode pads 162, 164 and 166 may be disposed at the edge region of the fourth semiconductor layer 136, as shown in FIGS. 11 to 15, or at a random region, but the disclosure is not limited thereto.

For example, as shown in FIGS. 11 to 15, the third electrode pad 162 may be disposed between the first electrode pad 142 and the second electrode pad 144, the first electrode pad 142 may be disposed between the third electrode pad 162 and the fourth electrode pad 164, and the second electrode pad 144 may be disposed between the third electrode pad 162 and the fifth electrode pad 166, but the disclosure is not limited thereto.

The first electrode 140 and the third electrode 160 may be interconnected through conductive connection members 170. Here, the conductive connection members 170 may be wires or be designated conductive structures, as described above, but the disclosure is not limited thereto.

As shown in FIG. 12, in order to prevent unnecessary electrical short between the conductive connection members 170 and the first and second areas 120 and 130, insulating members 182 may be formed between the conductive connection members 170 and the first and second areas 120 and 130.

As shown in FIG. 13, the conductive connection members 170 may be formed in an air bridge shape separated from the first and second areas 120 and 130 by a designated distance and interconnecting the first to fifth electrode pads 142, 144, 162, 164 and 166.

Figure 16:
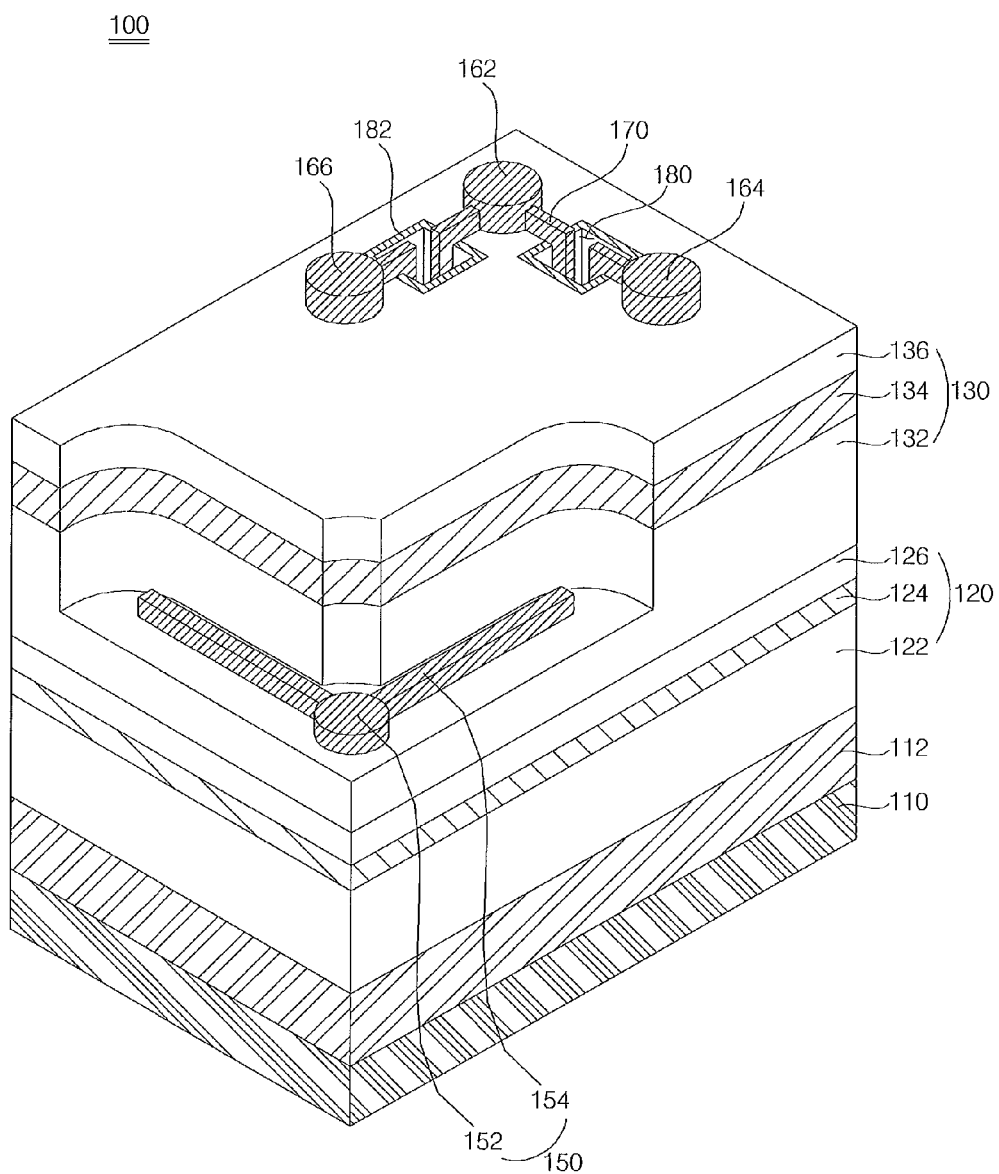
FIG. 16 is a perspective view of a light emitting device in accordance with another embodiment.
Figure 17:
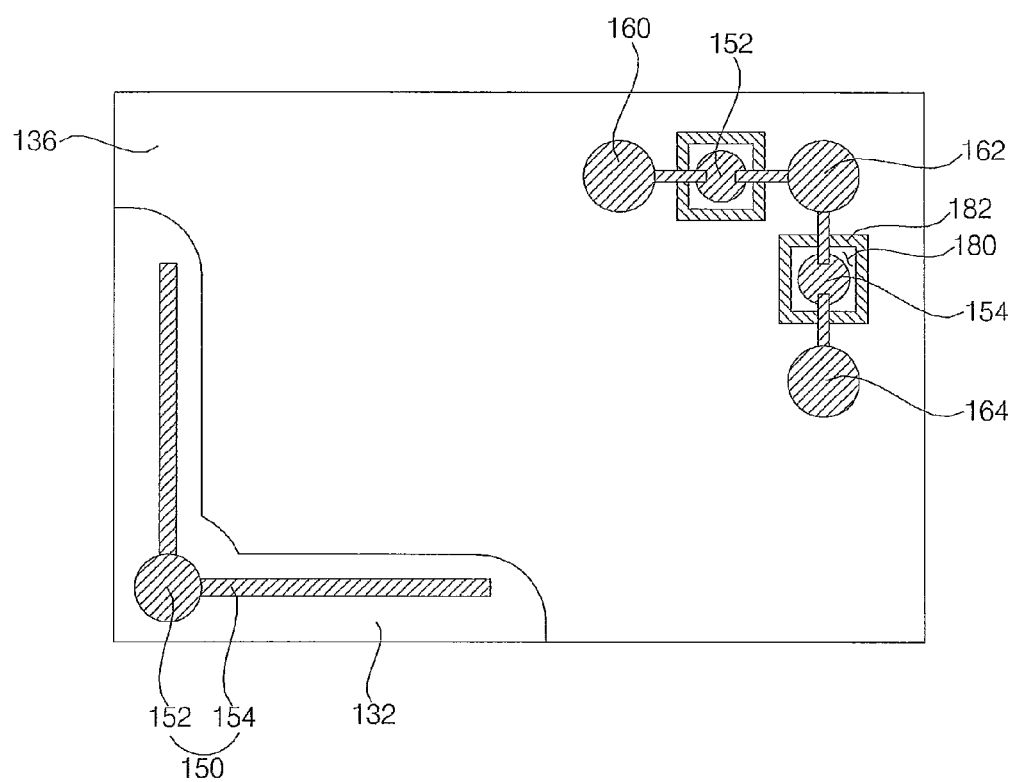
FIG. 17 is a plan view of the light emitting device in accordance with the embodiment.
Figure 18:
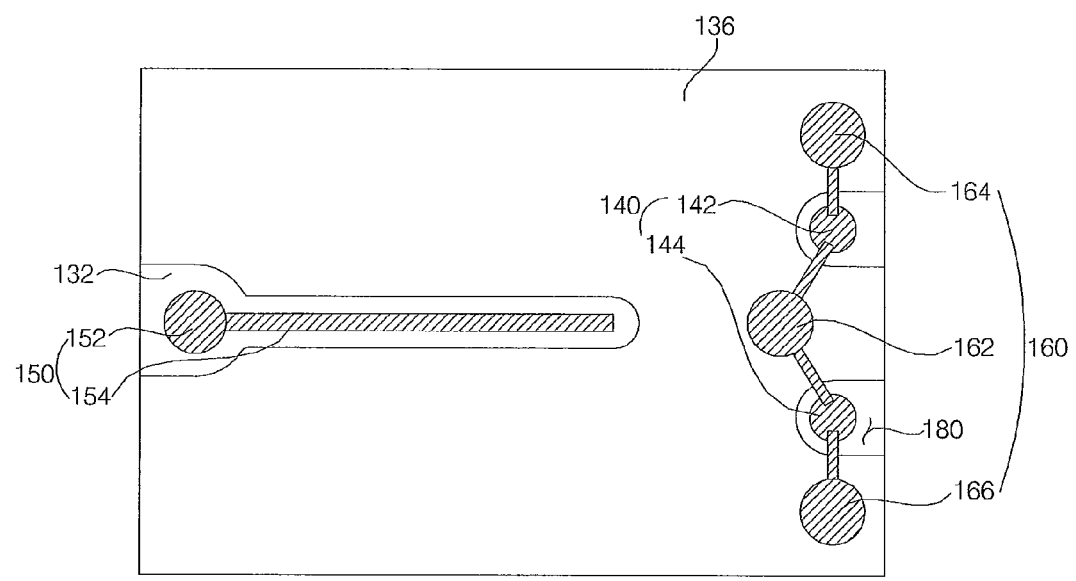
FIG. 18 is a plan view of the light emitting device in accordance with the embodiment.
Figure 19:
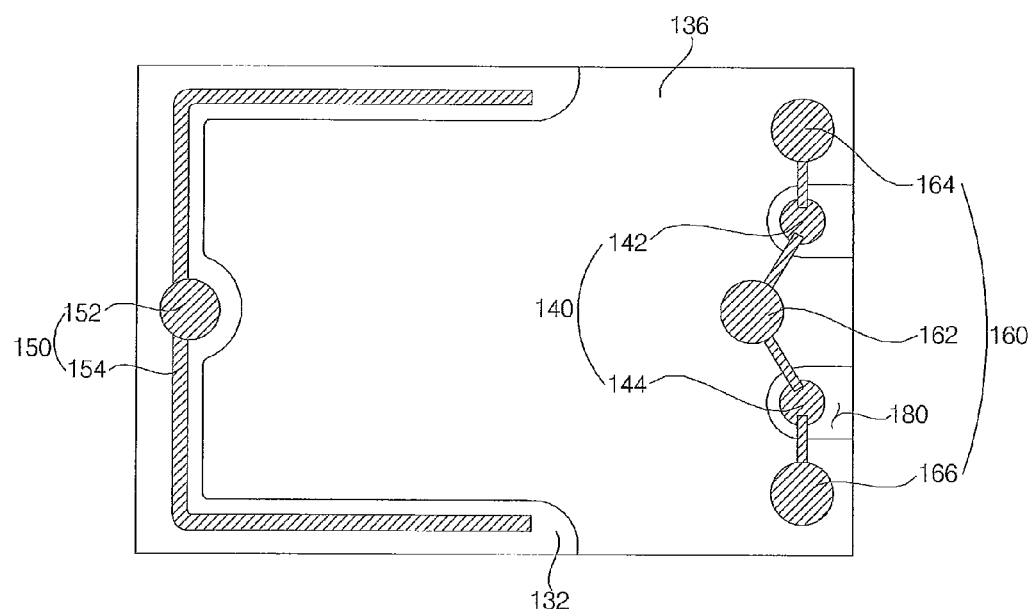
FIG. 19 is a plan view of the light emitting device in accordance with the embodiment.

FIG. 16 is a perspective view of a light emitting device in accordance with another embodiment, and FIGS. 17 to 19 are plan views of the light emitting device of FIG. 16.

With reference to FIGS. 16 to 19, the light emitting device 100 in accordance with the embodiment may include a second electrode 150, and the second electrode 150 may include a sixth electrode pad 152 and at least one finger electrode 154.

As described above, at least one region of the second area 130 may be removed so as to expose at least one region of the third semiconductor layer 132, and the second electrode 150 may be disposed at the exposed region.

In accordance with the embodiment, the second electrode 150 may include the electrode pad 152 and the at least one finger electrode 154. The at least one finger electrode 154 may be connected to the sixth electrode pad 152, and may extend in a designated direction in order to facilitate current spreading. The second area 130 may have an etching region extending in at least one direction so as to arrange the at least one finger electrode 154 on the third semiconductor layer 132, but the disclosure is not limited thereto.

For example, as shown in FIG. 18, the finger electrode 154 may extend in the direction toward the third electrode pad 162, and as shown in FIG. 19, two finger electrodes 154 may be disposed and extend in symmetrical directions. Further, a random number of finger electrodes (not shown) may be disposed and extend in directions toward the corners or random directions of the light emitting device 100, but the disclosure is not limited thereto.

Further, as shown in FIGS. 16 and 17, the first and third electrodes 140 and 160 and the second electrode 150 may be respectively disposed at corner regions of the light emitting device 100. For example, the first and third electrodes 140 and 160 may be disposed at a first corner region, and the second electrode 150 may be disposed at a second corner region which is diagonally opposite to the first corner region. Further, as shown in FIGS. 16 and 17, the second electrode 150 may include the finger electrodes 154 extending from the second corner region to other corner regions, but the disclosure is not limited thereto.

Figure 20:
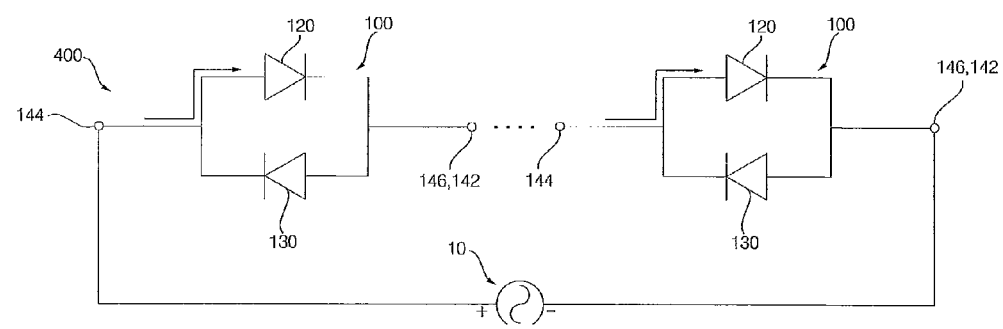
FIG. 20 is a circuit diagram of a lighting system comprising light emitting devices in accordance with one embodiment.
Figure 21:
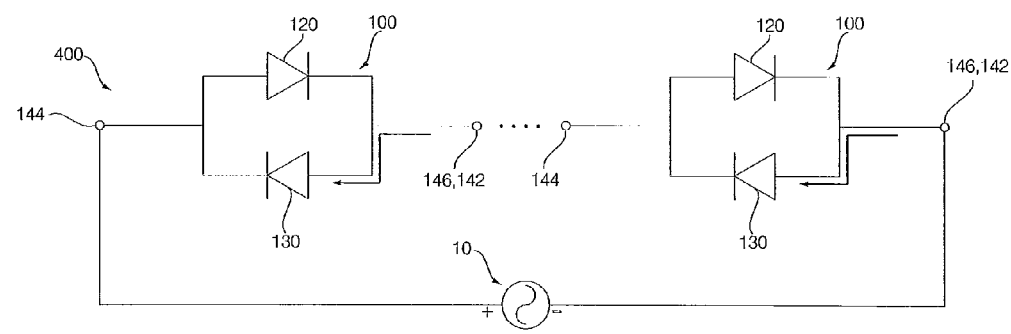
FIG. 21 is a circuit diagram of the lighting system comprising light emitting devices in accordance with the embodiment.

FIGS. 20 and 21 are circuit diagrams of a lighting system 200 comprising light emitting devices 100 in accordance with one embodiment.

With reference to FIGS. 20 and 21, the lighting system 200 comprising light emitting devices 100 in accordance with the embodiment may include at least one light emitting device 100, and the respective light emitting devices 100 may be connected in series.

The respective light emitting devices 100 may be connected through a designated circuit pattern on a substrate (not shown), thereby forming a light emitting device array. For example, the light emitting devices 100 may be mounted on a light emitting device packages 500 which will be described later and then the light emitting device packages 500 may be mounted on a substrate (not shown), or the light emitting devices 100 may be implemented in a chip on board (COB) type in which the light emitting devices 100 are mounted on a substrate (not shown), but the disclosure is not limited thereto.

Further, the lighting system 200 comprising the light emitting devices 100 in accordance with the embodiment may include a lighting apparatus, such as a lamp, a streetlight or a backlight unit, but the disclosure is not limited thereto.

Since the light emitting devices 100 in accordance with the embodiment includes the first area 120 and the second area 130 which generate different light in backward voltage and forward voltage phases of an AC power supply, if an AC power supply is connected to the lighting system 200 in accordance with the embodiment, the light emitting devices 100 may emit light in the case of both the backward voltage and forward voltage phases, and thus flickering of the lighting system 200 due to switching between the backward voltage and forward voltage phases may be prevented.

Figure 24:
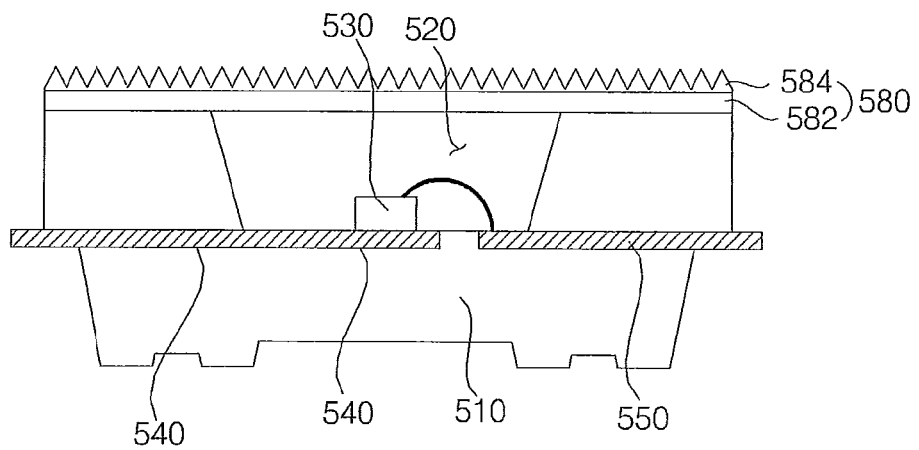
FIG. 24 is a cross-sectional view of the light emitting device package comprising the light emitting device in accordance with the embodiment.
Figure 25:
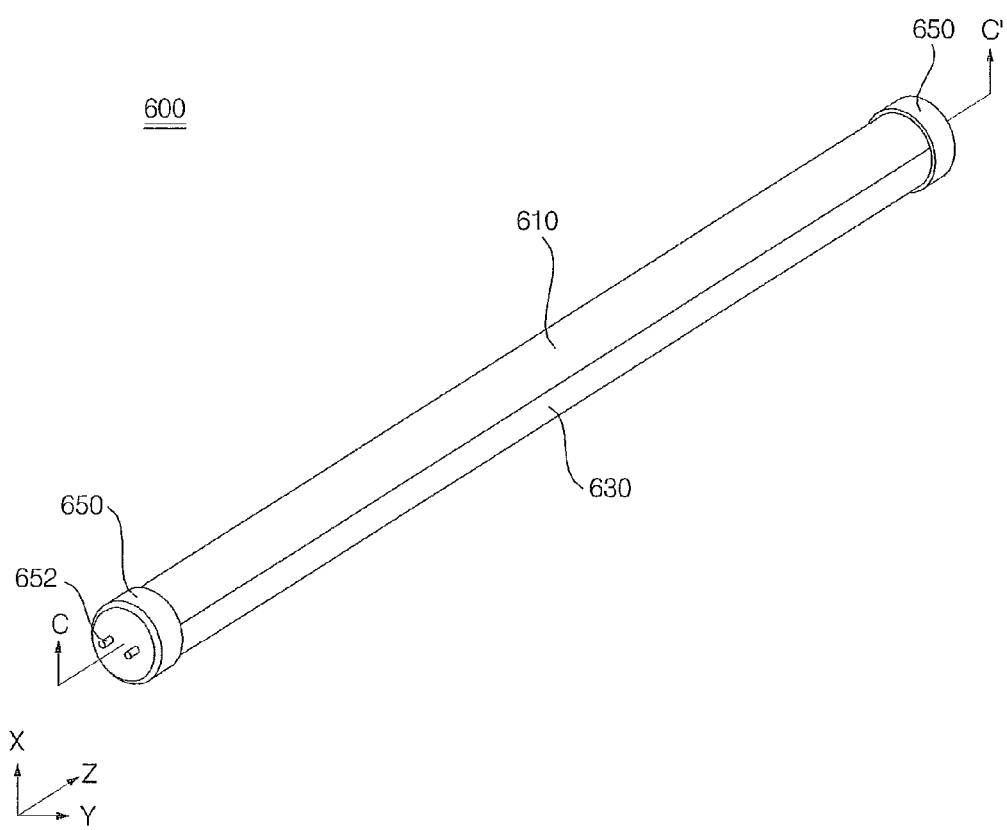
FIG. 25 is a perspective view of a lighting system comprising light emitting devices in accordance with one embodiment.

Further, since the respective light emitting devices 100 may be driven in the case of both the backward voltage and forward voltage phases and current paths corresponding to the respective phases may be formed, for example, several light emitting devices 100 may be disposed so as to be connected in series in the case of an AC power supply, as shown in FIGS. 24 and 25. Therefore, connection of the several light emitting devices 100 may become easy and output improvement and output adjustment of the lighting system 200 may be executed.

Figure 22:
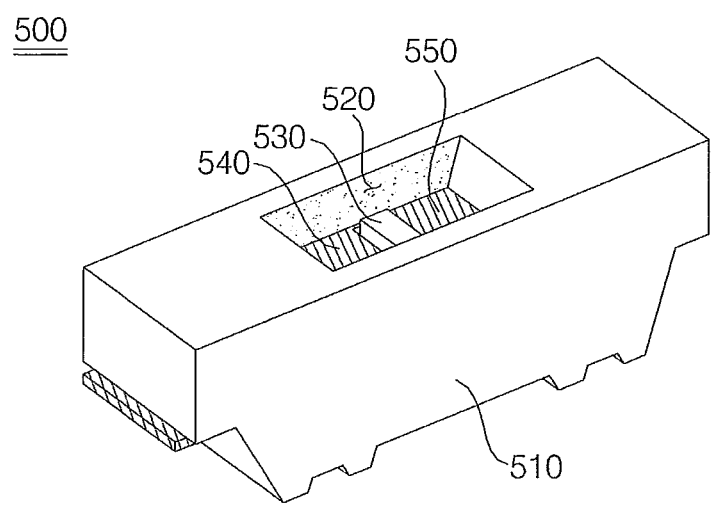
FIG. 22 is a perspective view of a light emitting device package comprising a light emitting device in accordance with one embodiment.
Figure 23:
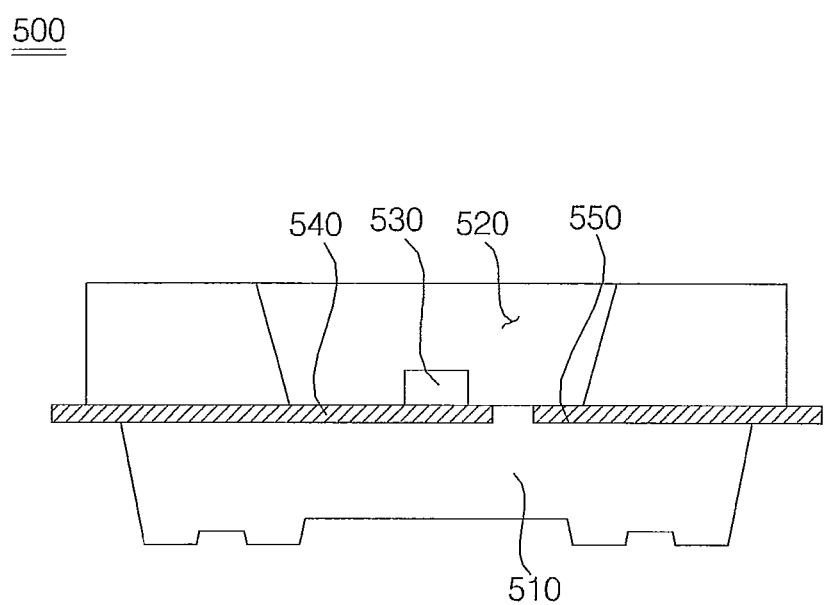
FIG. 23 is a cross-sectional view of the light emitting device package comprising the light emitting device in accordance with the embodiment.

FIGS. 22 to 24 are perspective and cross-sectional views of a light emitting device package 500 comprising a light emitting device in accordance with one embodiment.

With reference to FIGS. 22 to 24, the light emitting device package 500 may include a body 510 provided with a cavity 520, first and second lead frames 540 and 550 mounted in the body 510, a light emitting device 530 electrically connected to the first and second lead frames 540 and 550, and a resin layer (not shown) filling the cavity 520 to cover the light emitting device 530.

The body 510 may be formed of at least one selected from among the group consisting of a resin, such as polyphthalamide (PPA), silicon (Si), aluminum (Al), aluminum nitride (AlN), photo sensitive glass (PSG), polyamide 9T (PA9T), syndiotactic polystyrene (SPS), a metal, sapphire ($Al_2O_3$), beryllium oxide (BeO) and a printed circuit board (PCB). The body 510 may be formed through injection molding, etching, etc., but the disclosure is not limited thereto.

The inner surface of the body 510 may be inclined. The angle of reflection of light emitted from the light emitting device 530 may be varied of the angle of the inclined surface, and thereby, the orientation angle of light emitted to the outside may be adjusted.

As the orientation angle of light decreases, convergence of light emitted from the light emitting device 530 to the outside increases, and on the other hand, as the orientation angle of light increases, convergence of light emitted from the light emitting device 530 to the outside decreases.

The cavity 520 formed on the body 510 may have various planar shapes, such as a circle, a rectangle, a polygon, an oval and a shape with curved corners, but the disclosure is not limited thereto.

The light emitting device 530 may be mounted on the first lead frame 540 and, for example, may be a light emitting device which emits red, green, blue or white light or a UV light emitting device which emits ultraviolet light, but the disclosure is not limited thereto. Further, at least one light emitting device 530 may be mounted.

Further, the light emitting device 530 may be a horizontal type light emitting device provided with electrical terminals formed on the upper surface thereof, a vertical type light emitting device provided with electrical terminals formed on the upper and lower surfaces thereof, or a flip chip.

The light emitting device 530 in accordance with the embodiment may further include first and second light emitting structures (not shown), and the first and second light emitting structures (not shown) may be respectively driven by backward bias and forward bias. Therefore, the light emitting device package 500 in accordance with the embodiment may emit light in the case of both backward bias and forward bias of an AC power supply, and thus light emitting efficiency of the light emitting device package 500 may be improved.

Further, since a separate ESD device is not required in the case of an AC power supply, optical loss due to the ESD device in the light emitting device package 500 may be prevented.

The resin layer (not shown) may fill the cavity 520 so as to cover the light emitting device 530.

The resin layer (not shown) may be formed of silicon, epoxy or other resin materials, and be formed by filling the cavity 520 with a resin material and then hardening the material using ultraviolet light or heat.

Further, the resin layer (not shown) may include a phosphor, and a kind of the phosphor is selected of the wavelength of light emitted from the light emitting device 530 so as to enable the light emitting device 500 to produce white light.

Such a phosphor may be one of a blue light emitting phosphor, a blue-green light emitting phosphor, a green light emitting phosphor, a yellow-green light emitting phosphor, a yellow light emitting phosphor, a yellow-red light emitting phosphor, an orange light emitting phosphor and a red light emitting phosphor, of the wavelength of light emitted from the light emitting device 530.

That is, the phosphor may be excited by light of a first wavelength emitted from the light emitting device 530 and thus generate light of a second wavelength. For example, if the light emitting device 530 is a blue light emitting diode and the phosphor is a yellow phosphor, the yellow phosphor may be excited by blue light and then emit yellow light, blue light emitted from the blue light emitting diode and yellow light emitted from the phosphor excited by blue light are mixed, thereby allowing the light emitting device package 500 to provide white light.

Similarly, if the light emitting device 530 is a green light emitting diode, a magenta phosphor may be used or both blue and red phosphors may be used, and if the light emitting device 530 is a red light emitting diode, a cyan phosphor may be used or both blue and green phosphors may be used.

Such a phosphor may be a known YAG-based, TAG-based, sulfur-based, silicate-based, aluminate-based, nitride-based, carbide-based, nitridosilicate-based, borate-based, fluoride-based or phosphate-based phosphor.

The first and second lead frames 540 and 550 may be formed of a metal, for example, at least one selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof. Further, the first and second lead frames 540 and 550 may be formed to have a single layer structure or a multi-layer structure, but the disclosure is not limited thereto.

The first and second lead frames 540 and 550 are separated from each other and thus electrically isolated from each other. The light emitting device 530 may be mounted on the first and second lead frames 540 and 550, and the first and second lead frames 540 and 550 may directly contact the light emitting device 530 or be electrically connected to the light emitting device 530 through a conductive material, such as a soldering member (not shown). Further, the light emitting device 530 may be electrically connected to the first and second lead frames 540 and 550 through wire-bonding, but the disclosure is not limited thereto. Therefore, when a power supply is connected to the first and second lead frames 540 and 550, power may be applied to the light emitting device 530. Several lead frames (not shown) may be mounted in the body 510 and be electrically connected to the light emitting device 530, but the disclosure is not limited thereto.

With reference to FIG. 24, the light emitting device package 500 in accordance with the embodiment may include optical sheets 580, and the optical sheets 580 may include a base part 582 and a prism pattern 584.

The base part 582 is a support on which the prism pattern 584 is formed, and may be formed of a transparent material having excellent thermal stability, for example, one selected from the group consisting of polyethylene terephthalate (PET), polycarbonate (PC), polypropylene, polyethylene, polystyrene and polyepoxy, but the disclosure is not limited thereto.

Further, the base part 582 may include a phosphor (not shown). For example, the base part 582 may be formed by uniformly dispersing a phosphor (not shown) within a material forming the base part 582 and then hardening the material. If the base part 582 is formed in such a manner, the phosphor (not shown) may be uniformly distributed within the base part 582.

The prism pattern 584 having a three-dimensional structure and refracting and converging light may be formed on the base part 582. A material forming the prism pattern 584 may be acrylic resin, but the disclosure is not limited thereto.

The prism pattern 584 may include a plurality of linear prisms disposed in parallel in one direction on one surface of the base part 582, and the cross-section of the linear prisms which is perpendicular to the axial direction may be a triangle.

Since the prism pattern 584 converges light, if the optical sheets 580 are adhered to the light emitting device package 500, straightness of light may be improved and thus brightness of the light emitting device package 500 may be improved.

The prism pattern 584 may include a phosphor (not shown).

After the phosphor (not shown) is mixed with a material forming the prism pattern 584, for example, acrylic resin in a paste or a slurry state, the prism pattern 584 is formed. Therefore, the phosphor may be uniformly dispersed within the prism pattern 584.

If the prism pattern 584 includes the phosphor (not shown) in such a manner, uniformity and distribution of light of the light emitting device package 500 may be improved, and the orientation angle of the light emitting device package 500 may be improved due to light dispersing effects of the phosphor (not shown) in addition to light converging effects of the prism pattern 584.

A plurality of light emitting device packages 500 in accordance with the embodiment may be arrayed on a substrate, and optical members, such as a light guide panel, a prism sheet, a diffusion sheet, etc., may be disposed on an optical path of the light emitting device packages 500. Such light emitting device packages 500, substrate and optical members may function as a light unit. In accordance with another embodiment, the light emitting devices or the light emitting device packages in accordance with the above-described embodiments may constitute a display apparatus, an indicating apparatus or a lighting system, and, for example, the lighting system may include a lamp or a streetlight.

Figure 26:
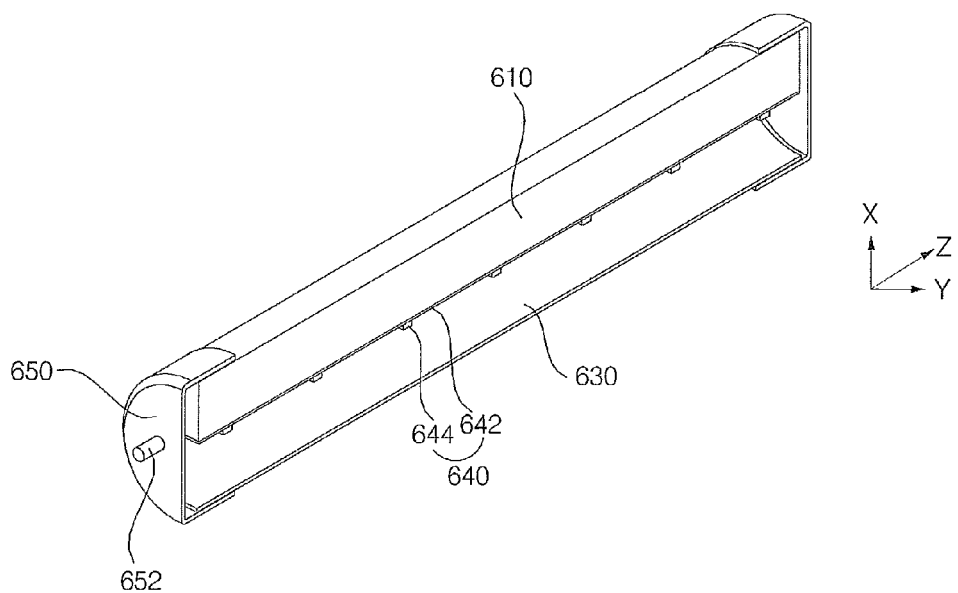
FIG. 26 is a cross-sectional view taken along the line C-C' of the lighting system of FIG. 25.

FIG. 25 is a perspective view of a lighting apparatus comprising light emitting device packages in accordance with one embodiment, and FIG. 26 is a cross-sectional view taken along the line C-C' of the lighting apparatus of FIG. 25.

With reference to FIGS. 25 and 26, the lighting apparatus 600 may include a body 610, a cover 630 coupled to the body 510, and end caps 650 located at both ends of the body 510.

A light emitting device module 640 is coupled to the lower surface of the body 610, and the body 610 may be formed of a metal having excellent conductivity and heat dissipation effects so as to discharge heat generated by light emitting device packages 644 to the outside through the upper surface of the body 610.

The light emitting device packages 644 emitting light of multiple colors are mounted in multiple rows on a PCB 642 to form an array. The light emitting device packages 644 may be mounted on the PCB 642 by the same interval or by various separation distances as needed, thereby being capable of adjusting brightness. As the PCB 642, a metal core PCB (MCPCB) or a PCB formed of FR4 may be used.

The light emitting device package 644 in accordance with the embodiment may include a light emitting device (not shown), the light emitting device (not shown) may include first and second light emitting structures (not shown), and the first and second light emitting structures (not shown) may be respectively driven by backward bias and forward bias. Therefore, the lighting apparatus 600 in accordance with the embodiment may emit light in the case of both the backward voltage and forward voltage phases of an AC power supply, and thus flickering of the lighting apparatus 600 may be eliminated and light emitting efficiency of the lighting apparatus 600 may be improved.

Since the light emitting device package 644 may include extending lead frames (not shown) to exhibit an improved heat dissipation function, reliability and efficiency of the light emitting device package 644 may be improved and lifespan of the light emitting device packages 644 and the lighting apparatus 600 comprising the light emitting device packages 644 may be extended.

The cover 630 may be formed in a cylindrical shape to surround the lower surface of the body 610, but the disclosure is not limited thereto.

The cover 630 protects the light emitting device module 640 installed therein from external foreign substances. Further, the cover 630 may include light diffusing particles to prevent glare of light generated from the light emitting device packages 644 and to uniformly discharge light to the outside, and a prism pattern may be formed on at least one of the inner surface and the outer surface of the cover 630. Further, a phosphor may be applied to at least one of the inner surface and the outer surface of the cover 630.

The cover 630 has excellent light transmittance so as to discharge light generated from the light emitting device packages 644 to the outside through the cover 630, and has sufficient heat resistance so as to withstand heat generated by the light emitting device packages 644. Therefore, the cover 630 may be formed of a material comprising polyethylene terephthalate (PET), polycarbonate (PC) or polymethylmethacrylate (PMMA).

The end caps 650 may be located at both ends of the body 610 and be used to seal a power supply device (not shown). Further, power pins 652 are formed on the end caps 650, and thus the lighting apparatus 600 in accordance with the embodiment may be directly attached to terminals, from which a conventional fluorescent lamp has been removed, without a separate device.

Figure 27:
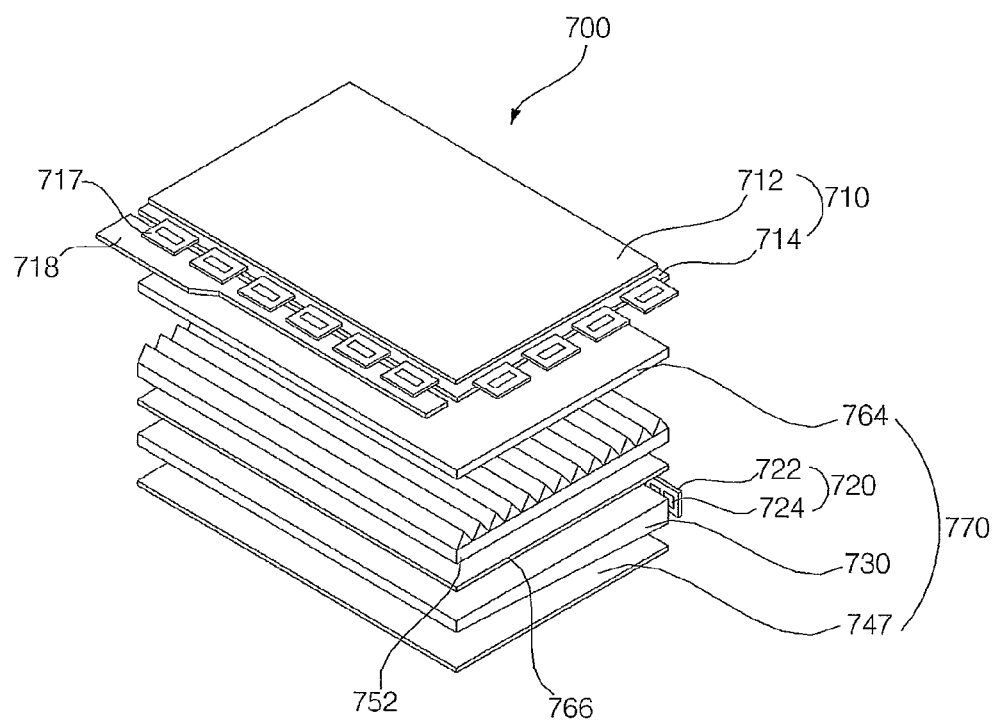
FIG. 27 is an exploded perspective of a liquid crystal display apparatus comprising light emitting devices in accordance with one embodiment.

FIG. 27 is an exploded perspective view of a liquid crystal display apparatus comprising light emitting device packages in accordance with one embodiment.

FIG. 27 illustrates an edge light type liquid crystal display apparatus 700, and the liquid crystal display apparatus 700 includes a liquid crystal display panel 710 and a backlight unit 770 to supply light to the liquid crystal display panel 710.

The liquid crystal display panel 710 may display an image using light supplied from the backlight unit 770. The liquid crystal display panel 710 may include a color filter substrate 712 and a thin film transistor substrate 714 disposed opposite each other under the condition that liquid crystals are disposed therebetween.

The color filter substrate 712 may produce color of the image displayed through the liquid crystal display panel 710.

The thin film transistor substrate 714 is electrically connected to a printed circuit board 718 on which a plurality of circuit parts is mounted through a drive film 717. The thin film transistor substrate 714 may apply drive voltage supplied from the printed circuit board 718 to the liquid crystals in response to a drive signal supplied from the printed circuit board 718.

The thin film transistor substrate 714 may include thin film transistors and pixel electrodes formed on a substrate formed of a transparent material, such as glass or plastic.

The backlight unit 770 includes a light emitting device module 720 outputting light, a light guide panel 730 to convert light supplied from the light emitting device module 670 into surface light and then to supply the surface light to the liquid crystal display panel 710, a plurality of films 750, 764 and 766 to uniformize brightness distribution of light supplied from the light guide panel 730 and to improve vertical incident properties, and a reflective sheet 740 to reflect light emitted from the rear surface of the light guide panel 730 toward the light guide panel 730.

The light emitting device module 720 may include a plurality of light emitting device packages 724, and a PCB 722 on which the plural light emitting device packages 724 are mounted to form an array.

The backlight unit 770 in accordance with the embodiment may include light emitting devices (not shown), the light emitting devices (not shown) may include first and second light emitting structures (not shown), and the first and second light emitting structures (not shown) may be respectively driven by backward bias and forward bias. Therefore, the backlight unit 770 in accordance with the embodiment may emit light in both the backward voltage and forward voltage phases of an AC power supply, and thus flickering of the backlight unit 770 may be eliminated and light emitting efficiency of the backlight unit 770 may be improved.

The plural films 750, 764 and 766 of the backlight unit 770 may include a diffusion film 766 to diffuse light incident from the light guide panel 730 toward the liquid crystal display panel 710, a prism film 750 to concentrate diffused light to improve vertical incident properties, and a protective film 764 to protect the prism film 750.

Figure 28:
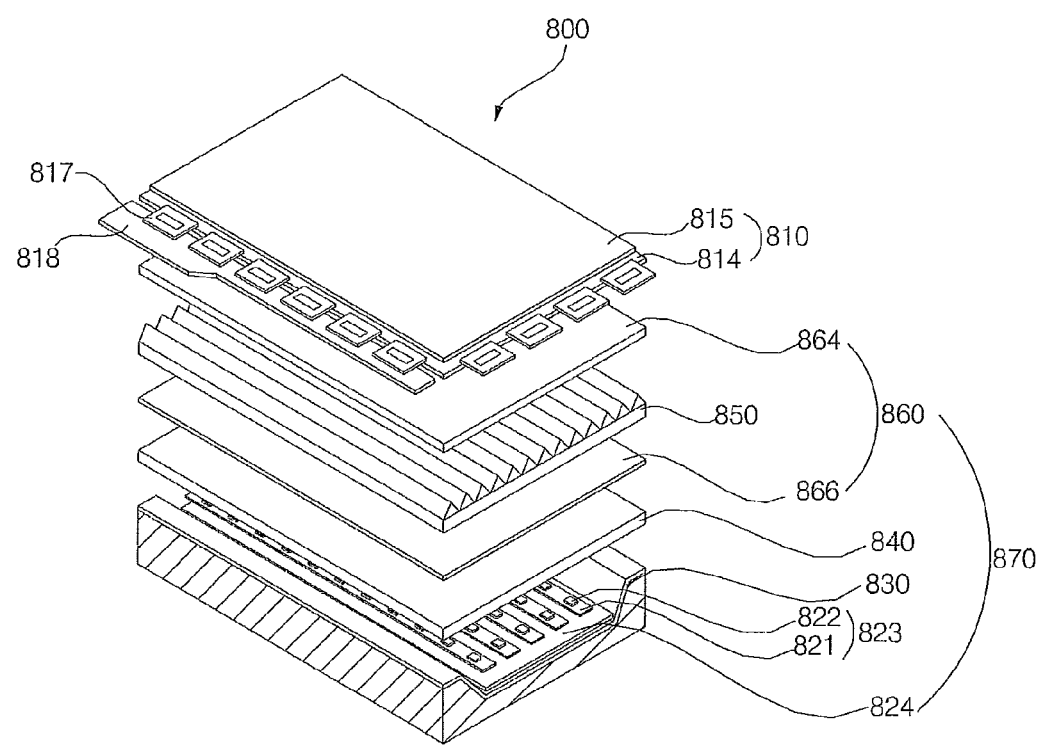
FIG. 28 is an exploded perspective of a liquid crystal display apparatus comprising light emitting devices in accordance with another embodiment.

FIG. 28 is an exploded perspective view of a liquid crystal display apparatus comprising light emitting device packages in accordance with another embodiment. Here, a description of components of FIG. 28 which are substantially the same as those of FIG. 27 will be omitted.

FIG. 28 illustrates a direct type liquid crystal display apparatus 800, and the liquid crystal display apparatus 800 includes a liquid crystal display panel 810 and a backlight unit 870 to supply light to the liquid crystal display panel 810.

The liquid crystal display panel 810 is the same as the liquid crystal display panel 710 of FIG. 27, and a detailed description thereof will thus be omitted.

The backlight unit 870 may include a plurality of light emitting device modules 823, a reflective sheet 824, a bottom chassis 830 in which the light emitting device modules 823 and the reflective sheet 824 are received, a diffusion plate 840 disposed above the light emitting device modules 823, and a plurality of optical films 860.

The light emitting device module 823 may include a plurality of light emitting device packages 822, and a PCB 821 on which the plurality of light emitting device packages 822 is mounted to form an array.

The backlight unit 870 in accordance with the embodiment may include light emitting devices (not shown), the light emitting device (not shown) may include first and second light emitting structures (not shown), and the first and second light emitting structures (not shown) may be respectively driven by backward bias and forward bias. Therefore, the backlight unit 870 in accordance with the embodiment may emit light in the case of both the backward voltage and forward voltage phases of an AC power supply, and thus flickering of the backlight unit 870 may be eliminated and light emitting efficiency of the backlight unit 870 may be improved.

The reflective sheet 824 reflects light emitted from the light emitting device packages 822 toward the liquid crystal display panel 810, thus improving light efficiency.

Light emitted form the light emitting device modules 823 is incident upon the diffusion plate 840, and the optical films 860 are disposed above the diffusion plate 840. The optical films 860 include a diffusion film 866, a prism film 850 and a protective film 864.

As is apparent from the above description, a light emitting device in accordance with one embodiment may be driven by both backward bias and forward bias of an AC power supply. Therefore, an AC power supply may be used as a power supply of the light emitting device without a separate rectification circuit. Thus, in the AC power supply, a separate device or apparatus, such as a rectification circuit or an ESD device, may be omitted.

Further, the light emitting device in accordance with the embodiment may achieve forward voltage driving and backward voltage driving of the AC power supply in one chip. Therefore, light emitting efficiency per unit area may be improved.

Further, the light emitting device in accordance with the embodiment may include a forward voltage drive structure and a backward voltage drive structure of the AC power supply in one chip and the forward voltage drive structure and the backward voltage drive structure may be grown through one process. Therefore, a fabrication process of the light emitting device may be simplified and economic efficiency of the light emitting device may be improved.

Further, the light emitting device in accordance with the embodiment may have various electrode arrangements, thus maximizing current spreading and light emitting efficiency.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:
1. A light emitting device comprising:
a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and the second area disposed on the first semiconductor and provided with first and second trenches formed from the fourth semiconductor layer to the first semiconductor layer and separated from each other;

a first electrode comprising first and second electrode pad disposed on the first semiconductor layer exposed by the first and second trenches;

a second electrode disposed on the exposed region of the third semiconductor layer and a hole formed at the exposed region, disposed on the second semiconductor layer, and electrically connected to the second and third semiconductor layers; and a third electrode disposed on the fourth semiconductor layer and comprising a third electrode pad contacting the first and second electrode pad, a fourth electrode pad contacting the first electrode pad and a fifth electrode pad contacting the second electrode pad.

2. The light emitting device of claim 1, further comprising conductive connection member disposed among the first and fifth electrode pads to electrically connect the first and third electrode.

3. The light emitting device of claim 2, wherein the conductive connection member is separated from the inner surfaces of the first and second trenches.

4. The light emitting device of claim 2, further comprising insulating member disposed on the inner surfaces of the first and second trenches, wherein the conductive connection member is disposed on the side surfaces of the insulating members.

5. The light emitting device of claim 1, wherein the size of the third electrode pad is greater than the size of at least one of the fourth and fifth electrode pads.

6. The light emitting device of claim 1, wherein the third electrode pad is disposed on a same imaginary line as one of the fourth and fifth electrode pads, or is arranged on a different imaginary line from at least one of the fourth and fifth electrode pads.

7. The light emitting device of claim 1, wherein the first electrode includes a sixth electrode pad and at least one finger electrode extending from the sixth electrode pad.

8. The light emitting device of claim 7, wherein the at least one finger electrode is disposed adjacent to the third electrode pad.

9. The light emitting device of claim 7, wherein:

the at least one finger electrode includes first and second finger electrodes extending from the sixth electrode pad; and the first and second finger electrodes extend in direction intersecting each other, or extend in directions parallel with each other.

10. The light emitting device of claim 9, wherein:

the first and third electrodes have an L shape; and a distance between the first and third electrodes is greater than a distance between the fourth electrode pad and the first finger electrode or a distance between the fifth electrode pad and the second finger electrode.

11. A light emitting device package comprising:

a light emitting device comprising a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and the second area disposed on the first semiconductor and provided with first and second trenches formed from the fourth semiconductor layer to the first semiconductor layer and separated from each other, a first electrode comprising first and second electrode pad disposed on the first semiconductor layer exposed by the first and second trenches, a second electrode disposed on the exposed region of the third semiconductor layer and a hole formed at the exposed region, disposed on the second semiconductor layer, and electrically connected to the second and third semiconductor layers, and a third electrode disposed on the fourth semiconductor layer and comprising a third electrode pad contacting the first and second electrode pad, a fourth electrode pad contacting the first electrode pad and a fifth electrode pad contacting the second electrode pad; and a body comprising first and second lead frames electrically connected to the light emitting device.

12. The light emitting device package of claim 11, wherein the body is provided with a cavity formed on the first and second lead frames so that the light emitting device is disposed in the cavity.

13. The light emitting device package of claim 12, further comprising a resin material filling the cavity.

14. The light emitting device package of claim 13, wherein the resin material comprises at least one of light transmitting silicon, a phosphor, a light diffusing agent or(and) a light dispersing agent.

15. The light emitting device package of claim 11, further comprising optical sheets disposed on the body.

16. A lighting system comprising:

light emitting device packages, each light emitting device package comprising a light emitting device comprising a light emitting structure comprising a first area comprising a first semiconductor layer doped with a first dopant, a second semiconductor layer doped with a second dopant and a first active layer disposed between the first and second semiconductor layers, and a second area comprising a third semiconductor layer doped with the first dopant and comprising an exposed region, a fourth semiconductor layer disposed on the third semiconductor layer except for the exposed region and doped with the second dopant and a second active layer disposed between the third and fourth semiconductor layers, and provided with first and second trenches formed from the fourth semiconductor layer to the first semiconductor layer and separated from each other, a first electrode comprising first and second electrode pad disposed on the first semiconductor layer exposed by the first and second trenches, a second electrode disposed on the exposed region of the third semiconductor layer and a hole formed at the exposed region, disposed on the second semiconductor layer, and electrically connected to the second and third semiconductor layers, and a third electrode disposed on the fourth semiconductor layer and comprising a third electrode pad contacting the first and second electrode pad, a fourth electrode pad contacting the first electrode pad and a fifth electrode pad contacting the second electrode pad, and a body comprising first and second lead frames electrically connected to the light emitting device; and a substrate on which the light emitting device packages are arranged.

* * * * *